US006809518B2

(12) United States Patent
Beaudoin et al.

(10) Patent No.: US 6,809,518 B2
(45) Date of Patent: Oct. 26, 2004

(54) SYSTEM AND METHOD FOR CONVERTING ADIABATIC RF PULSES INTO PSEUDO ADIABATIC RF PULSES

(76) Inventors: Gilles Beaudoin, 1560 rue Sherbrooke est, Montreal, Quebec (CA), H2L 4M1; Jean-Charles Côte, 1560 rue Sherbrooke est, Montreal, Quebec (CA), H2L 4M1

( * ) Notice: Subject to any disclaimer, the term of this patent is extended or adjusted under 35 U.S.C. 154(b) by 0 days.

(21) Appl. No.: 10/441,563

(22) Filed: May 20, 2003

(65) Prior Publication Data

US 2003/0234647 A1 Dec. 25, 2003

Related U.S. Application Data

(63) Continuation-in-part of application No. 09/606,922, filed on Jun. 29, 2000, now abandoned.

(30) Foreign Application Priority Data

Jun. 29, 1999 (CA) .............................................. 2276603

(51) Int. Cl.[7] ................................................ G01V 3/00
(52) U.S. Cl. ....................................... 324/314; 324/307
(58) Field of Search ................................... 324/314, 315, 324/312, 307, 309, 300; 600/410

(56) References Cited

U.S. PATENT DOCUMENTS

| 5,019,784 | A | * | 5/1991 | Garwood et al. | 324/307 |
| 6,005,390 | A | * | 12/1999 | Watanabe et al. | 324/307 |
| 6,064,207 | A | * | 5/2000 | Kupce | 324/314 |
| 6,094,049 | A | * | 7/2000 | Rosenfeld et al. | 324/307 |
| 6,448,769 | B1 | * | 9/2002 | Rosenfeld et al. | 324/307 |

* cited by examiner

*Primary Examiner*—Louis Arana
(74) *Attorney, Agent, or Firm*—Altera Law Group, LLC

(57) ABSTRACT

Adiabatic RF pulses are very useful in MRI when precise flip angles are needed. Unfortunately, adiabatic pulses suffer from a long application time and a high SAR. A new concept to modify the usual adiabatic pulse into a "pseudo-adiabatic" pulse having a shorter application time and lower SAR is introduced. For example, a BIR-4 of 32 ms of application time and a relative SAR of 20 will be transformed into a BIR-4-S1 of 1 ms and relative SAR of 1. The new pulse obtained stays insensitive for a large $B_1$ range but loses its slice selectivity to become a 3D pulse. Experimental results are presented to illustrate the sensitivity to $B_1$ and $B_0$.

6 Claims, 24 Drawing Sheets a) Carte relative $B_1$ b) Carte $T_1$ STE Rect.

c) Carte $T_1$ LL Rect.

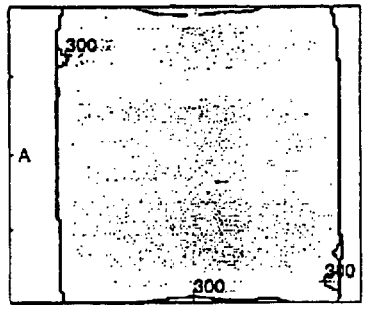
a) TOMROP-Look-Locker $T_1$ mapping:
α=BIR-4-S2(540°) and γ=BIR-4-S2(390°)
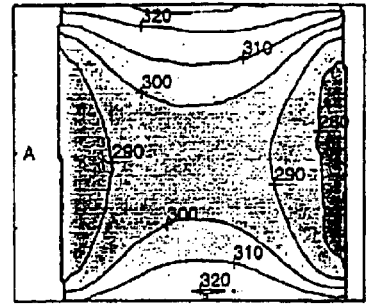
b) TOMROP-Look-Locker $T_1$ mapping:
α=BIR-4-S2(540°) and γ=Rect(30°)
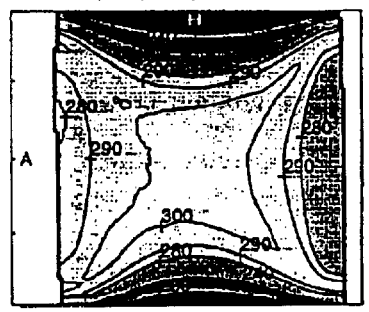
c) TOMROP-Look-Locker $T_1$ mapping:
α=Rect(180°) and γ=BIR-4-S2(390°)
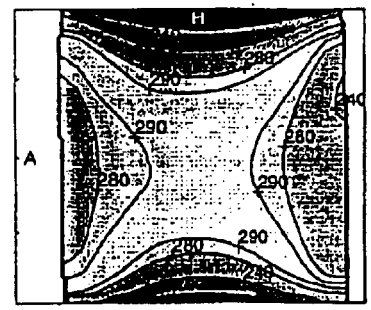
d) TOMROP-Look-Locker $T_1$ mapping:
α=Rect(180°) and γ=Rect(30°)
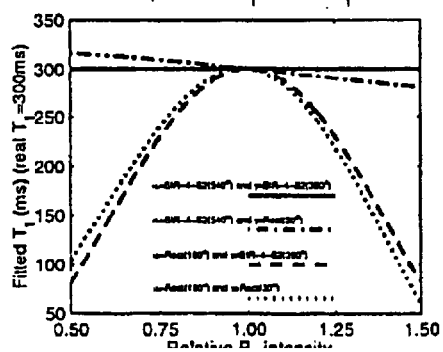
e) Effect of $B_1$ on fitted $T_1$
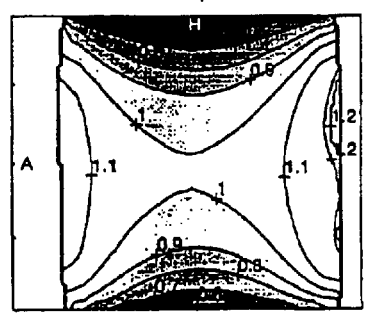
f) Relative $B_1$ mapping a) $T_1$ mapping using BIR-4-S2 pulses b) $T_1$ mapping using rectangular pulses c) Effect of $B_1$ on fitted $T_1$ d) Relative $B_1$ mapping

SYSTEM AND METHOD FOR CONVERTING ADIABATIC RF PULSES INTO PSEUDO ADIABATIC RF PULSES

This application is a Continuation-in-part of Ser. No. 09/606,922, filed Jun. 29, 2000, now abandoned.

FIELD OF THE INVENTION

The present invention relates to adiabatic RF pulses which are used particularly for magnetic resonance imaging (MRI). The invention concerns a new type of adiabatic RF pulse, its uses and a method of creating the same.

Adiabatic pulses are very useful in magnetic resonance imaging (MRI) when precise flip angles are needed, such as in quantitative $T_1$ mapping. But in clinical MRI their use is limited because of the increase in the specific absorption rate (SAR) and the application time to respect the adiabatic condition, compared to sinc or rectangular RF pulses. The present invention concerns a concept based on the sequentialization of adiabatic pulses in order to produce an adiabatic-quality RF pulse. This concept allows to obtain precise flip angles with a smaller SAR and a shorter application time than a true adiabatic pulse, but at the cost of slice-selectiveness.

The new adiabatic RF pulse according to the invention is a combination of two fundamentally opposed characteristics, i.e. precision of the flip angle and power efficiency.

Presently, in order to obtain a precise flip angle for the whole useful volume of MRI antennas, one must use adiabatic type pulses. However, these pulses require a great amount of power. This power is often not available in clinical MRI machines and, could not be used either for reasons of security, since they tend to produce overheating.

In order to avoid difficulties intrinsic to adiabatic pulses, rectangular pulses are often used by MRI clinical machines. They are power efficient and rapid. However, the flip angle produced by rectangular pulses is very sensitive to magnetic homogeneity of the antenna. Therefore, the result error on the flip angle exceeds 50% in an antenna.

This error on the flip angles induces a great variability with respect to the results of quantification sequences based on the hypothesis of a precise flip. The new pulses described herein combine precision for flip and power efficiency. They permit the realisation of very precise quantification measures using a typical clinical MRI machine.

It is in this precision that the new RF concept finds its most important commercial interest. Due to the great uniformity obtained by these pulses, they become an element of choice for quantitative studies such as gel dosimetry.

The dosimetry of analysing radiation by gel is a new field in full emergence. These new developments in dosimetry facilitate validation of radiotherapy treatment and are most likely going to replace old techniques.

Gel dosimetry requires relaxometric measures of great precision on large volumes. The new concept of RF excitation presented herein and its application are perfectly adapted to this technique and surpass existing tools.

$T_1$ cartography by stimulated echo sequences and Look-Locker are the most commonly used to measure relaxation $T_1$ in MRI. They have performances for clinical use needing only a few minutes to produce a map of values of $T_1$. These sequences remain however extremely sensitive to the precision of the RF pulses which re-orient the magnetisation to produce the measured signals.

RF rectangular pulses regularly used in MRI create a flip of the magnetisation directly proportional to the intensity of the magnetic field $B_1$ produced. Clinical antennas have field distributions $B_1$ which fluctuate enormously. As an example, the antenna used to produce images of a head has a field $B_1$ which is distributed in its useful volume in a range going from 0,5 to 1,2 relative to the centre. This spatial variation of $B_1$ systematically creates error on the adjusted values of $T_1$ exceeding 50%.

The development of a new concept RF excitation, following a tangential approach, having adiabatic property permitting the replacement of adiabatic half-pulses and its use as a BIR-4-S2 ($B_1$-Insensitive Rotation-4 AHP-Sequentialized 2 steps) in cartography sequences $T_1$ has permitted to reduce this error to less than 10% in the case of measurements by compensated stimulated echoes and to less than 5% for a Look-Locker.

The BIR-4-S2 has an imprecision on the flip angle of less than 5° in a range going from 0,75 to 1,75 about a field of reference $B_{1ref}$, for a choice of flip of over 360°. Contrary to adiabatic pulses, it remains a three dimensional RF pulse with low power being able to be used over and over clinically without risking overheating for the patients.

The sequence of compensated stimulated echoes referred to above uses another development: compensation. The signal produced by a traditional sequence tends towards zero following relaxation $T_1$ in time. Sometimes this causes problems when the signal of the last echoes begins to be influenced by noise. The compensation modifies the exponential decrease of the signal. This change operates by taking into account relaxation $T_1$ when calculating the flip angles necessary to the sequence. Compensation transfers a part of the requirement of a volume of signal of the first echoes towards the last. One can then compensate entirely and thus program a sequence which will produce equal signals between all the echoes or compensate partially to maintain the signals of the last echoes all the while conserving a maximum of total signal.

The following description is divided into three chapters, where chapter 1 introduces a new concept for fast 3D adiabatic quality RF pulses for MRI. Chapter 2 describes the TOMROP-Look-Locker $T_1$ mapping using the new BIR-4-S2 RF pulse and Chapter 3 describes a $T_1$ mapping using compensated stimulated echoes and the new BIR-4-S2 RF pulse.

SUMMARY OF THE INVENTION

The present invention concerns a system and method for converting an Adiabatic pulse for use in magnetic resonance imaging applications into a pseudo adiabatic pulse.

In accordance with the invention, there is provided, in an MRI system, a method for converting an adiabatic RF pulse into a pseudo adiabatic pulse having at least one step, said MRI system including a magnet for producing a magnetic field about a subject, gradient coils, RF coils, means for emitting an RF pulse and means for receiving RF waves, and means for analyzing said RF waves, said adiabatic RF pulse having at least one adiabatic half passage, said method comprising the steps of:

setting the angle, time step and desired RF power for each time step within a pseudo adiabatic half passage in said means for emitting an RF pulse;

replacing each half passage adiabatic pulse with at least one RF pulse of predetermined power which is adapted to provide a magnetic field vector at said angle from a main magnetic field.

In accordance with the invention, there is also provided an MRI system comprising:

a magnet for producing a magnetic field about a subject;

gradient coils;

RF coils;

means for emitting an RF pulse and means for receiving RF waves;

means for analyzing said RF waves;

means for converting an adiabatic RF pulse having at least one adiabatic half passage into a pseudo adiabatic RF pulse comprising means for setting the angle, time step and desired RF power for each time step within a pseudo adiabatic half passage in said means for emitting an RF pulse; and means for replacing each half passage adiabatic pulse with at least one RF pulse of predetermined power which is adapted to provide a magnetic field vector at said angle from a main magnetic field.

DESCRIPTION OF THE FIGURES

The present invention will be better understood by reading the following non restrictive description of preferred embodiments thereof made in reference to the following drawings:

FIG. 1a represents the relative map of the RF intensity $B_1$ according to maps shown in FIGS. 1b and 1c.

FIGS. 2c–2e describe the new concept of excitation described herein. The principle consists to turn by half a turn at each step the magnetisation about the magnetic component of the RF field, number of steps being equal or greater to one, and here represented from one to three.

FIG. 3a shows compensated stimulated echoes and FIG. 3b shows TOMROP-Look-Locker. FIG. 3c shows conventional rectangular RF pulses being used in stimulated echoes and FIG. 3d shows the TOMROP-Look-Locker.

FIG. 6a shows AHP-Si with only one step of $\vec{B}_{eff}$ placed at 45° from the $\hat{z}$ axis and $\vec{M}$ precessing around it to land on the transverse plane at $\hat{y}$. FIG. 6b shows AHP-S2 with two steps of $\vec{B}_{eff}$ placed at 22.5° and 67.5° from the $\hat{z}$ axis applied one after the other to permit at $\vec{M}$ to precess half a turn around each. FIG. 6c shows AHP-S3 with three $\vec{B}_{eff}$ steps at 15°, 45° and 75° from $\hat{z}$ sequentialized to carry $\vec{M}$ to the transverse plane.

FIGS. 18a–18f illustrate TOMROP-Look-Locker $T_1$ mapping obtained on a smooth rectangular (50×20×10 cm) water solution ($T_1 \approx 300$ ms) phantom into a head coil with the major axis along the $B_0\hat{z}$ main magnetic field and the minor axis normal to the sagital slice display (FOV 240×240 mm). The four combinations of BIR-4-S2 and rectangular pulse for $\alpha$ and $\gamma$ are as shown in the following figures: $\alpha$=BIR-4-S2 540° and $\gamma$=BIR-4-S2 390°, as shown in FIG. 18a; $\alpha$=BIR-4-S2 540° and $\gamma$=rectangular 30°, as shown in FIG. 18b; $\alpha$=rectangular 180$\alpha$ and $\gamma$=BIR-4-S2 390°, as shown in FIG. 18c; $\alpha$=*rectangular* 180° and $\gamma$=rectangular 30°, as shown in FIG. 18d and the simulation of the effect of $B_1$ on fitted $T_1$, as shown in FIG. 18e. The BIR-4-S2 is considered exact and the rectangular pulse with its flip angle changing linearly with $B_1$. The data are simulated in accordance with equation 1 and fitted with MINUIT to obtain $T_1$. The four combinations of BIR-4-S2 and rectangular pulse for $\alpha$ and $\gamma$ are shown. The simulated $T_1$ value is 300 ms. FIG. 18f illustrates $B_1$ mapping of the phantom placed in the head coil. The distribution is relative to the center of the coil and phantom, and goes from 0.5 (darkest) to 1.21 (lightest) of relative RF amplitude.

FIG. 22c illustrates simulation of the effect of $B_1$ on the fitted $T_1$. The BIR-4-S2 is considered exact and, for the rectangular pulse, the flip angle changes linearly with $B_1$. The data are simulated following the equations 2 to 5 and fitted with MINUIT to obtain $T_1$. The two sets of RF pulses BIR-4-S2 and rectangular are shown. The simulated $T_1$ value is 300 ms. FIG. 22d illustrates $B_1$ mapping of the phantom in the head coil. The distribution is relative to the center of the coil and phantom and vary from 0.45 (darkest) to 1.19 (lightest) of relative RF amplitude.

DESCRIPTION OF A PREFERRED EMBODIMENT OF THE INVENTION

As the reader will appreciate, the present invention is directed to the field of magnetic resonance imaging, or MRI. More specifically, the present invention is directed to RF pulses that are used in MRI.

The present description assumes that the reader has knowledge of the theory underlying MRIs and therefore a detailed description will not be presented herein.

Figure 24:
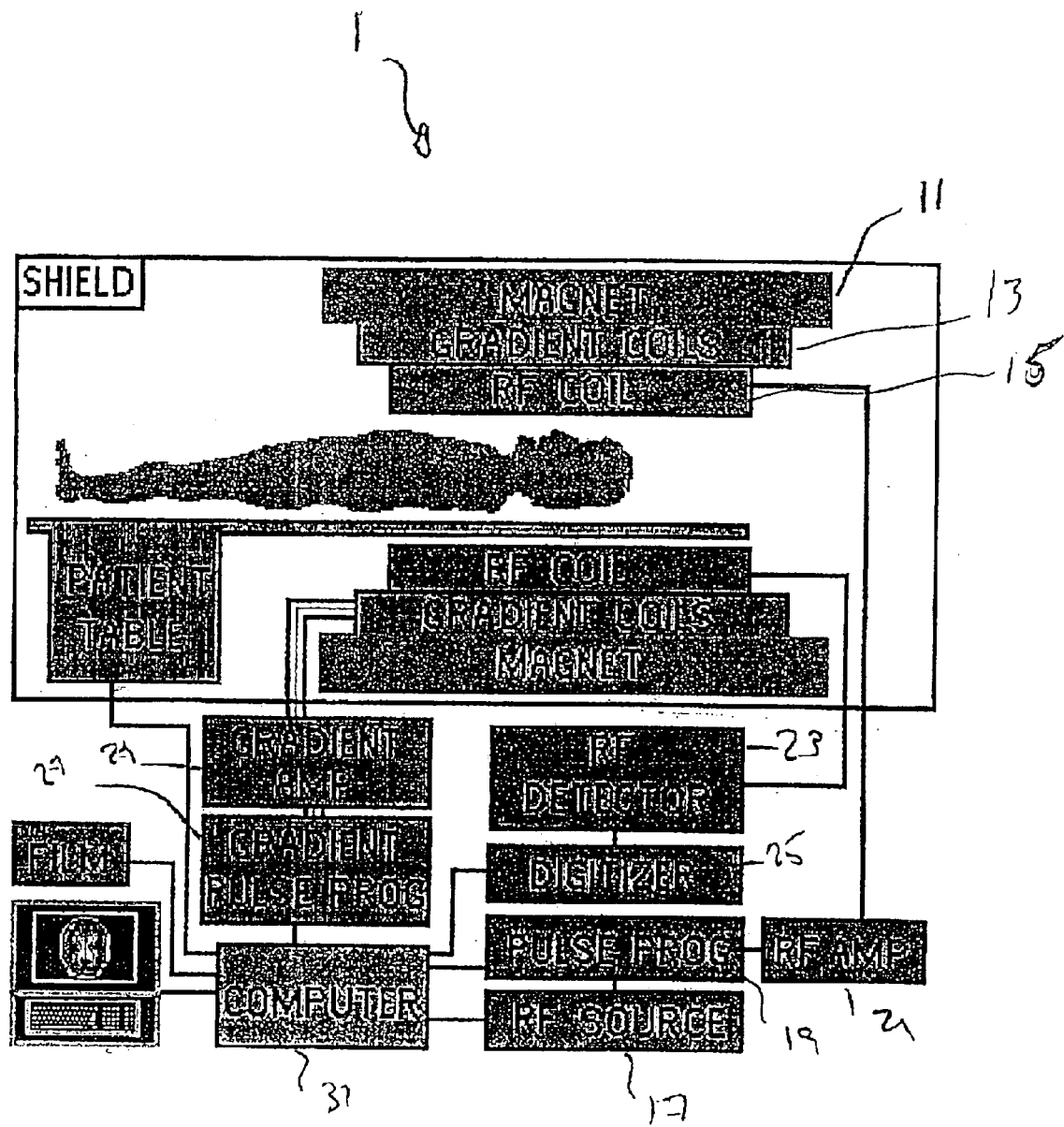
FIG. 24 is a schematic representation of an MRI apparatus.

However, the basic elements of an MRI are shown in FIG. 24 and will be briefly described herein.

An MRI 1 generally consists of a magnet 11 for creating a magnetic field. Gradient coils 13 and RF coils 15 are also used. For the purposes of the present invention, the RF coil 15 will be of interest.

Other components include an RF source 17, a pulse programmer 19, an RF amplifier 21, all operatively connected to the RF coil 15. An RF detector 23 and a digitizer 25 are also present for receiving RF waves and converting the same. Similarly, a gradient pulse programmer 27 and a gradient amplifier 29 are operatively connected to the gradient coils 13, which are used to produce deliberate variations in the main magnetic field.

A specially programmed general purpose computer 31 controls the operation of the MRI, and outputs the results of the MRI either on a screen or on film. It should be noted that a dedicated computer may also be used instead of the general purpose computer 31.

A variety of different RF pulses can be used, but the present invention is concerned with the production of an RF pulse which has quasi-adiabatic properties, but without the associated disadvantages described above.

Stated simply, the present invention concerns a method for converting the half adiabatic pulses used for example in a BIR-4 adiabatic RF pulse (the characteristics of which are known in the art) into pseudoadiabatic half passage, giving us a BIR-4-Si pulse.

The first step in the method is to set the number of sequentialisation or segmentation steps, the higher the number of steps the better the results, but the longer it takes. Then the angle, time step and desired RF power are set for each step within a pseudo adiabatic half passage. As an example, for a BIR-4-S1 pulse, each half passage adiabatic pulse is replaced by a single RF pulse which gives a magnetic field vector at a 45 degree angle from the main magnetic field. The duration and power used for the pulse is calibrated in such a way that the magnetisation vector of the protons precesses 180 degrees around the RF pulse's magnetic field. This is repeated for each of the 4 parts of the BIR-4-S1 pulse. The resulting pulse sequence is a BIR-4-S1 pseudo adiabatic pulse. The same methodology can be applied to any level of sequentialisation.

The following description will focus mainly on the BIR-4-Si pulse, but it will be apparent to a person skilled in the art that the present invention can also be applied to any adiabatic pulse, with the proper modifications, of course.

Chapter I: Fast 3D Adiabatic Quality RF Pulse for MRI

Introduction

Figure 1A:
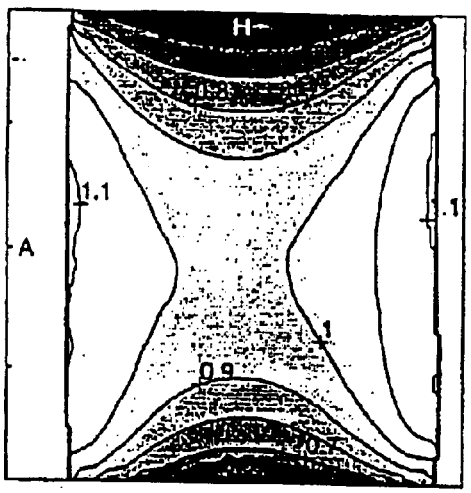
FIGS. 1a–1c represent sagital cross-sections of $T_1$ cartography of a rectangular mannequin filled with an aqueous solution having $T_1$ approximately 300 ms. Conventional rectangular RF pulses are used in sequence of stimulated echoes, FIG. 1b and TOMROP-Look-Locker, FIG. 1c.
Figure 1B:
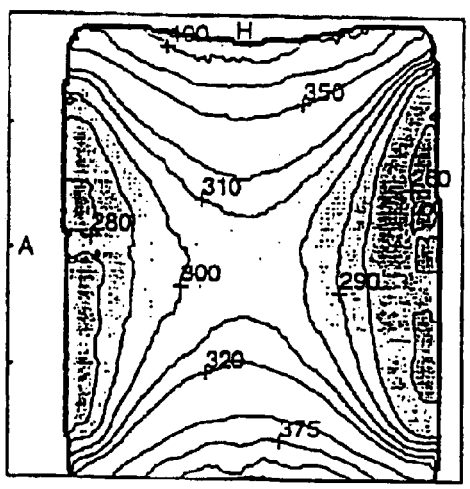
Figure 1C:
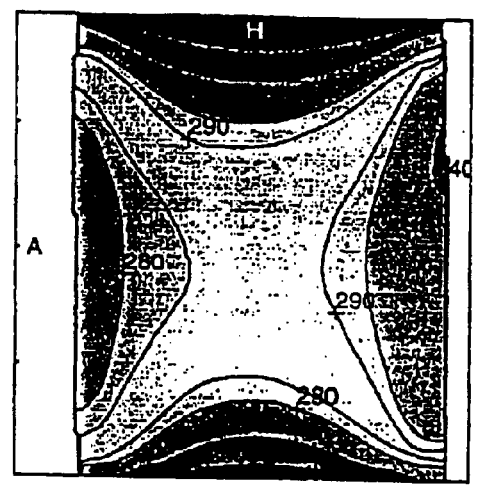
Figure 2A:
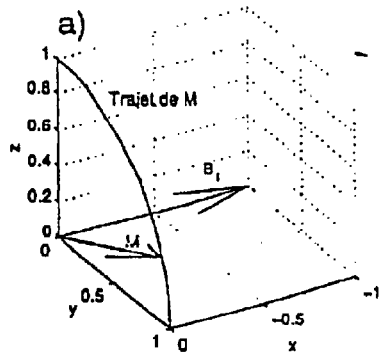
FIGS. 2a–2e are schematic representations of rectangular and AHP RF pulses.
Figure 2B:
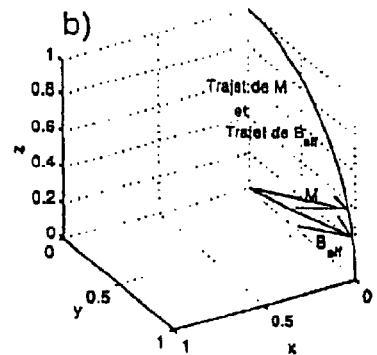
Figure 2C:
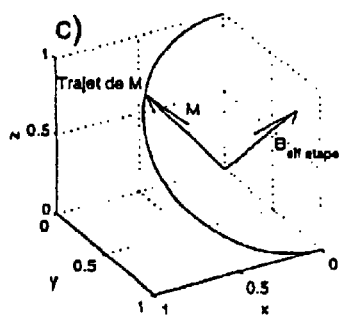
Figure 2D:
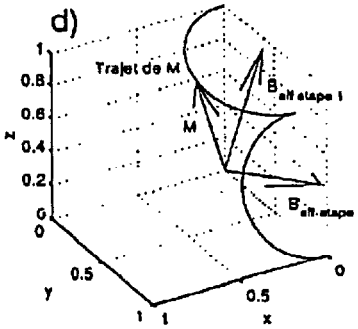
Figure 2E:
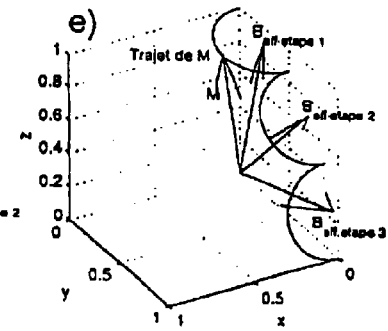
Figure 3A:
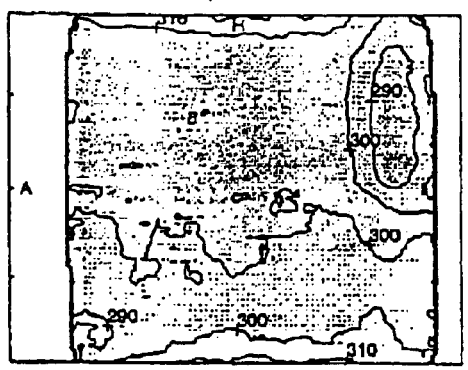
FIGS. 3a–3d show a sagital cross section of $T_1$ cartographies for a rectangular mannequin filled with an aqueous solution having $T_1$ approximately 300 ms. RF BIR-4-S2 are used in the sequences.
Figure 3B:
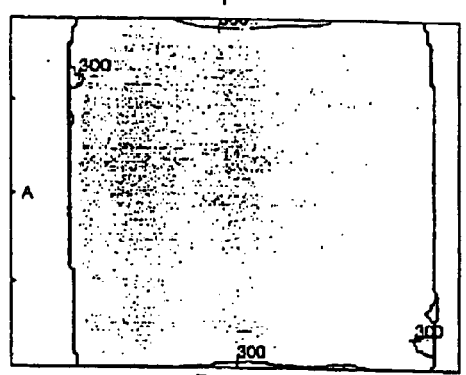
Figure 3C:
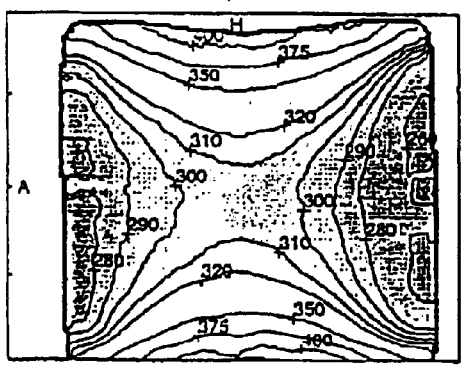
Figure 3D:
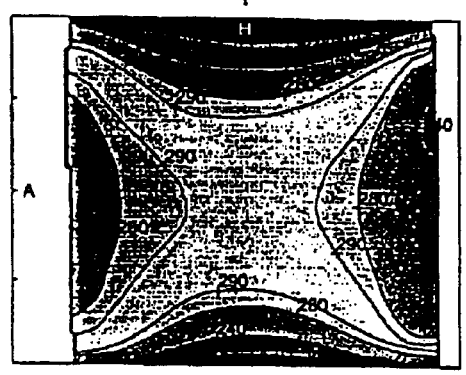
Figure 4:
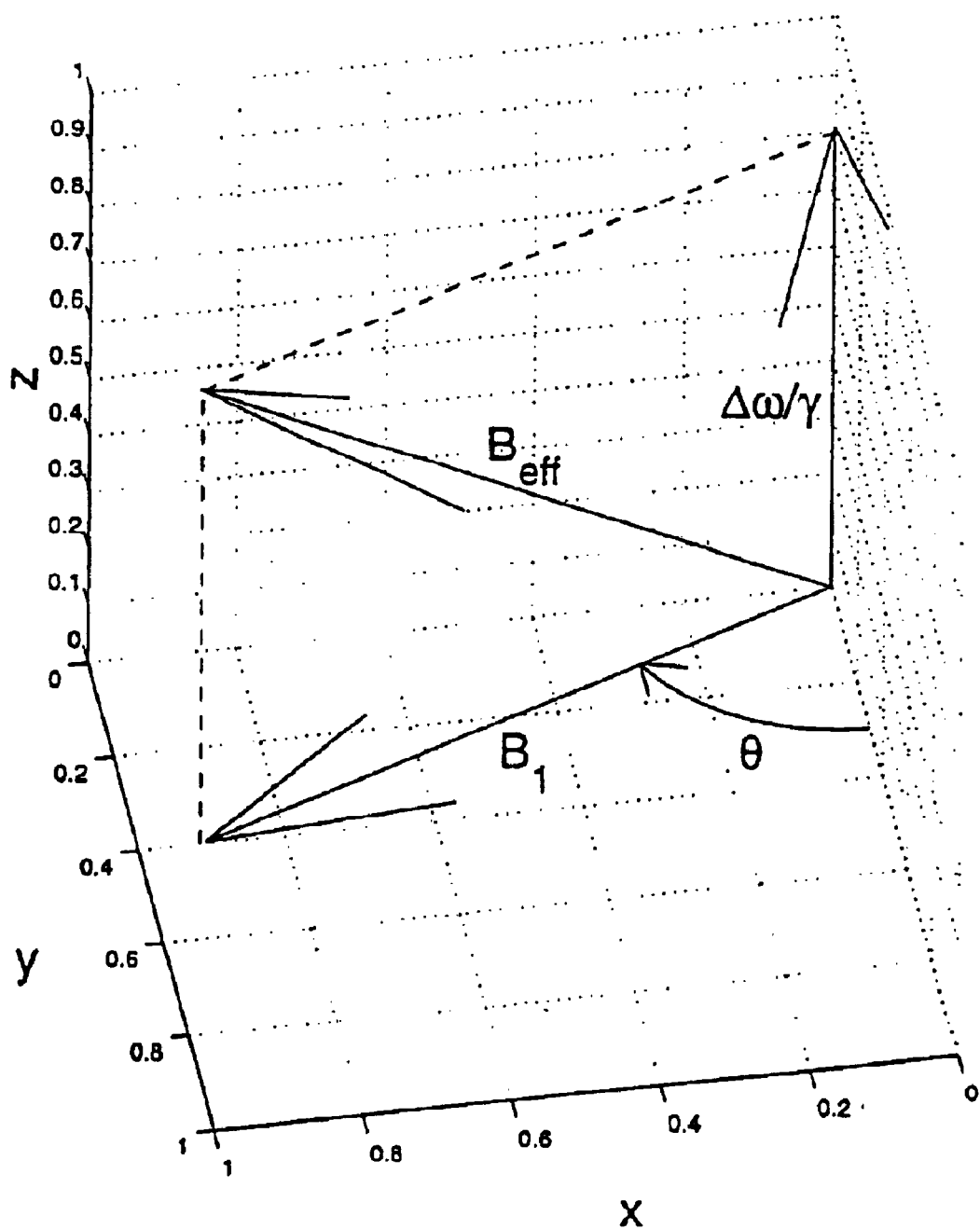
FIG. 4 illustrates the definition of $\vec{B}_{eff}$ in its referential. $\vec{B}_1$ (transversal) is the magnetic portion of the RF and $\Delta\vec{\omega}/\gamma$ (longitudinal) is the frequency offset of the RF.

The basics of the present invention consists of a $\vec{B}_{eff}$ RF component (FIG. 4) that flips the magnetisation from the rest state, longitudinal to the main magnetic field, to land into the transverse plane. The resulting magnetisation arrives tangentially to the transverse plane. The simplest example is a $\vec{B}_{eff}$ at 45° from the longitudinal axis. The magnetisation rotates around $\vec{B}_{eff}$ and will graze the transverse plane. Another flip angle could be obtained by adjusting the $\vec{B}_{eff}$ position relative to the magnetisation to be flipped.

The transverse plane could be reached in two or more $\vec{B}_{eff}$ steps. A two step pulse will start with $\vec{B}_{eff}$ at 22.5° from the longitudinal axis followed by a $\vec{B}_{eff}$ at 67.5°, each one applied just long enough to allow the time for the magnetisation to rotate half a turn around it.

This new kind of pulse can efficiently replace the adiabatic half passage (AHP) pulse, to which people tend when the number of steps is increased.

Figure 5A:
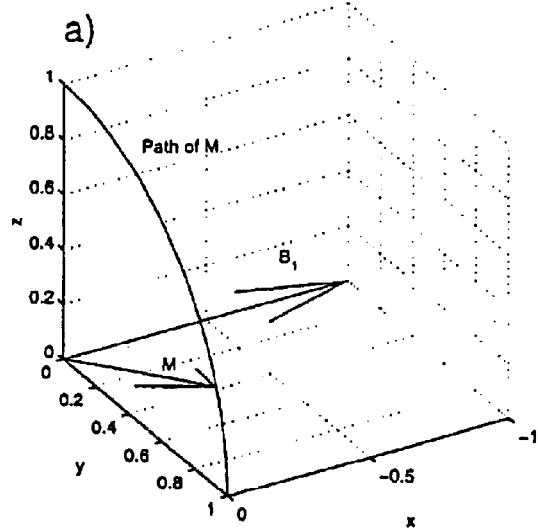
FIG. 5a illustrates a diagram of rectangular 90° RF pulse. $\vec{B}_1$ applied and $\vec{M}$ precessing around it from $\hat{z}$ to $\hat{y}$.
Figure 5B:
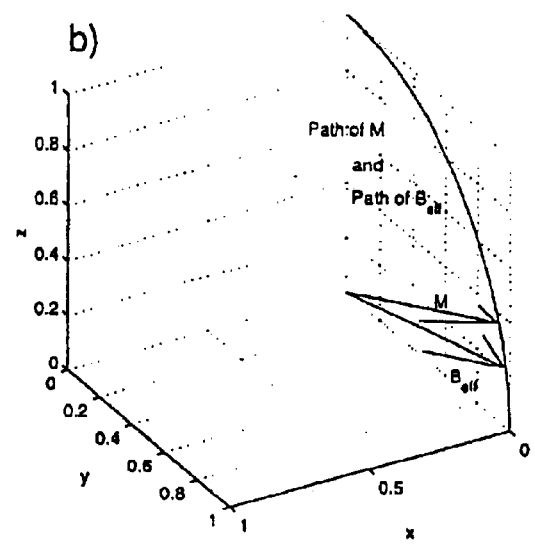
FIG. 5b illustrates a diagram of an AHP: $\vec{B}_{eff}$ applied on it path from $\hat{z}$ to $(\hat{y})$ and $\vec{M}$ and A following it.
Figures 6A, 6B, 6C:
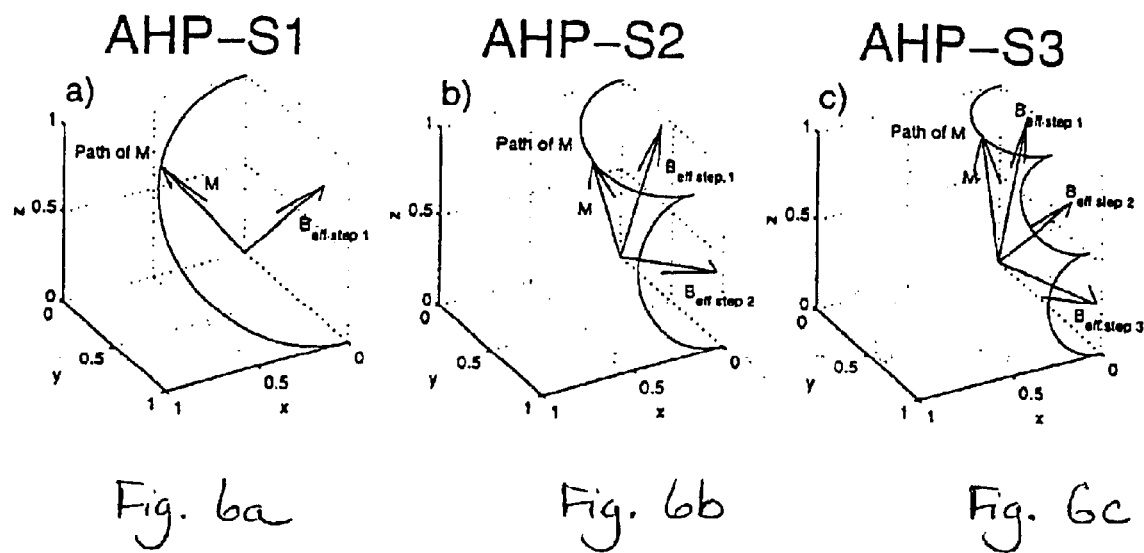
FIGS. 6a–6c illustrate diagrams of AHP concerted with the method of the present invention.

Using the present concept of sequentialization, we can minimise the number of RF pulse steps to minimise the application time and SAR. The RF pulses thus produced are no longer truly adiabatic and therefore there is no need for optimisation to take into account the adiabatic condition. These RF pulses still produce a uniform flip of the magnetisation within an RF power range. In FIGS. 5 and 6, we present the path followed by the magnetisation around the $\vec{B}_{eff}$ due to the RF in the $\vec{B}_{eff}$ frame of reference. The effect of the RF is shown or a standard rectangular 90° pulse and an AHP (FIG. 5), and for an AHP-S1,2,3 with 1, 2 and 3 sequence steps (FIG. 6). In table 1, we compare the performance of a rectangular 90°, AHP-S1 and AHP pulses.

We can see that the application time must be adjusted in function of $\vec{B}_{eff}$ such that the magnetisation has time to rotate half a turn around $\vec{B}_{eff}$ at each step. If this condition is respected, we obtain a perfect flip angle and the whole 3D magnetisation is in phase with respect to a theoretical flip. If the condition is not respected, the flip angle will be nearly obtained for a wide range of $\vec{B}_1$ and the whole 3D magnetisation would be somewhat out of phase with respect to a theoretical flip. In most clinical MRI sequences the out-of-phase magnetisation will not affect the image since the absolute value is used in the magnitude image. When a high $\vec{B}_1$ inhomogeneity produces a large range of phases through a small volume (voxel size) this results in a seemingly problematic partial annihilation of the magnetisation. However, in commercial MR, this is negligible due to the small and smooth variation of $\vec{B}_1$.

Any adiabatic RF pulse that is based on AHP can be adapted using the sequentialization concept. The AFP, BIR-4, BISS-8 and others, must first be decomposed in AHP and then sequentialized as in FIG. 6. For these pulses, we add the "-Si" suffix, signifying "Sequentialized with i steps", in each AHP composing the new pulse.

In the process of sequentialization, the RF adiabatic pulses that were slice-selective lose this property. In the sequentialization process, we cannot apply the method ordinarily used in adiabatic or regular pulses to obtain slice-selectiveness and keep the high quality of the flip angle. This limits the application of our pulse to 3D sequences.

Simulation

We simulated the effect of this method for the BIR-4-S1, 2,3 and 40 pulses. We divided the BIR-4 in four AHP or time-reversed AHP (IAHP) to apply the concept of sequentialization, so for i steps per AHP or IAHP, we have:

$$j = \{1, 2, 3, \ldots NP\} \text{ with } NP = 4i \qquad (1)$$

for the first (IAHP)

$$\left(j \leq \frac{NP}{4}\right)$$

and fourth quarter (AHP)

$$\left(j > \frac{3NP}{4}\right):$$

$$\vec{B}_{eff}(j) = \left\{0\hat{x}; B_1\hat{y}; -B_{1ref}\tan\left(2\pi\frac{j-\frac{1}{2}}{NP}\right)\hat{z}\right\} \qquad (2)$$

and for the second (AHP)

$$\left(\frac{NP}{2} \geq j > \frac{NP}{4}\right)$$

and third quarter (IAHP)

$$\left(\frac{3NP}{4} \geq j > \frac{NP}{2}\right):$$

$$\vec{B}_{eff}(j) = \left\{B_1\sin\left(\frac{\alpha_{req}}{2}\right)\hat{x}; B_1\cos\left(\frac{\alpha_{req}}{2}\right)\hat{y}; B_{1ref}\tan\left(2\pi\frac{j-\frac{1}{2}}{NP}\right)\hat{z}\right\} \qquad (3)$$

where, $\alpha_{req}$ is the flip angle requested, $B_1$ the actual amplitude of transverse magnetic field produced by the RF coil while $B_{1ref}$ is the reference amplitude field to which the pulse is adjusted ($B_1 = B_{1ref}$ for the perfect case).

We have calculated the effect of this RF field on two 3D magnetisation vectors, $\vec{m}_1$ and $\vec{m}_2$, with initial values:

$$\vec{m}_{1\ init} = \{0\hat{x}; 0\hat{y}; 1\hat{z}\} \qquad (4)$$

$$\vec{m}_{2\ init} = \{0\hat{x}; -1\hat{y}; 0\hat{z}\} \qquad (5)$$

The first vector $\vec{m}_1$ will inform us on the flip angle produced by the RF pulse:

$$\alpha = \arccos(\vec{m} \cdot \hat{z}) \qquad (6)$$

and on the resulting phase:

$$\theta = \text{sign}(\vec{m}_{1x})\arccos\left(\frac{m_{1y}}{\sqrt{m_{1x}^2 + m_{1y}^2}}\right) \qquad (7)$$

The second vector $\vec{m}_2$ gives us the rotation of the 3D magnetisation around $\vec{m}_1$ at the end of the pulse:

$$\phi = \text{sign}(\vec{m}_2 \cdot (\vec{m}_{1ref} \times \vec{m}_{2ref}))\arccos(\vec{m}_2 \cdot \vec{m}_{2ref}) \qquad (8)$$

with, $$\vec{m}_{k\,ref} = \vec{m}_{k\,init} \begin{pmatrix} \cos(\theta) & \sin(\theta) & 0 \\ -\sin(\theta) & \cos(\theta) & 0 \\ 0 & 0 & 1 \end{pmatrix} \begin{pmatrix} 1 & 0 & 0 \\ 0 & \cos(\alpha) & -\sin(\alpha) \\ 0 & \sin(\alpha) & \cos(\alpha) \end{pmatrix} \begin{pmatrix} \cos(\theta) & -\sin(\theta) & 0 \\ \sin(\theta) & \cos(\theta) & 0 \\ 0 & 0 & 1 \end{pmatrix} \quad (9)$$

where k may be either 1 or 2.

Figure 7:
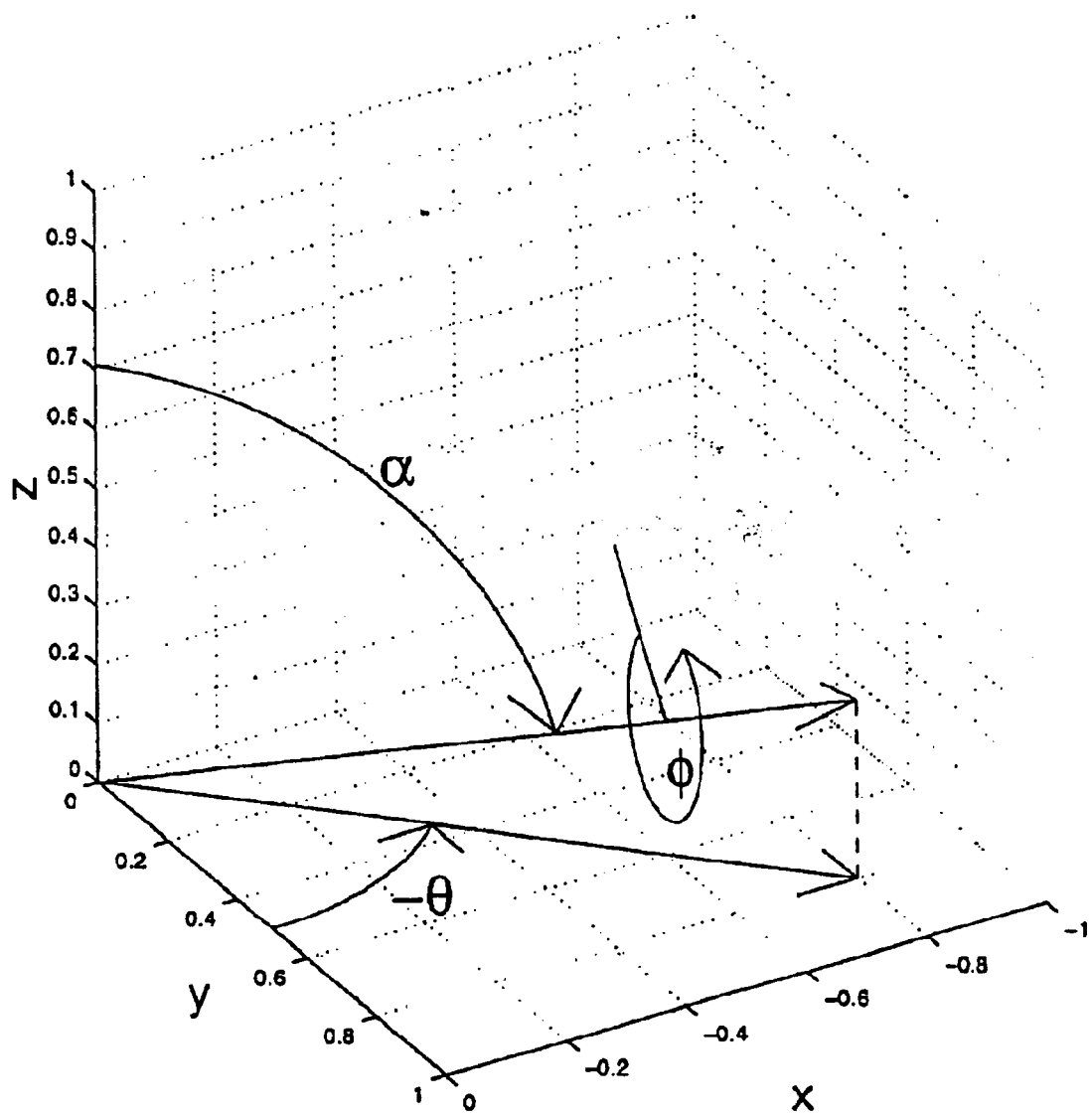
FIG. 7 illustrates the definition of the angles used in the simulation: $\alpha$ from the $\hat{z}$ axis, $\theta$ in the transverse plane from the $\hat{y}$ axis and $\phi$ around the vector itself.

With these three angles ($\alpha$, $\theta$, $\phi$) (represented in FIG. 7), we can analyse the effect of our RF pulse on the 3D magnetisation.

The simulation is performed by computing the rotation of the 3D magnetisation sequentially around each $\vec{B}_{\mathit{eff}}(j)$ by an angle:

$$\delta(j) = \gamma |\vec{B}_{\mathit{eff}}(j)| t_{\mathit{step}}(j) \quad (10)$$

where $\gamma$ is the gyromagnetic ratio and $t_{\mathit{step}}(j)$ is the time of application of the step j with $\vec{B}_{\mathit{eff}}(j)$.

In the first level of optimisation, we use a perfect $\vec{B}_{\mathit{eff}}(j)$ set ($B_1 = B_{1ref}$) and vary the time of application from zero to the time required to produce a complete rotation of the magnetisation around $\vec{B}_{\mathit{eff}}(j)$ at each step. Taking into account the properties of the BIR-4 pulse, we simulate a flip angle $\alpha$ from 0° to 720°. The results are presented in FIG. 8 and show the differences between the magnetisation flip from our BIR-4-Si and a theoretical flip of angle $\alpha_{req}$ around the $\hat{x}$ axis. No graphs are presented for $\Delta\phi$ as it is less than 0.001° throughout. Table 2 presents the definitions of $\Delta\alpha$, $\Delta\theta$ and $\Delta\phi$.

Figure 8:
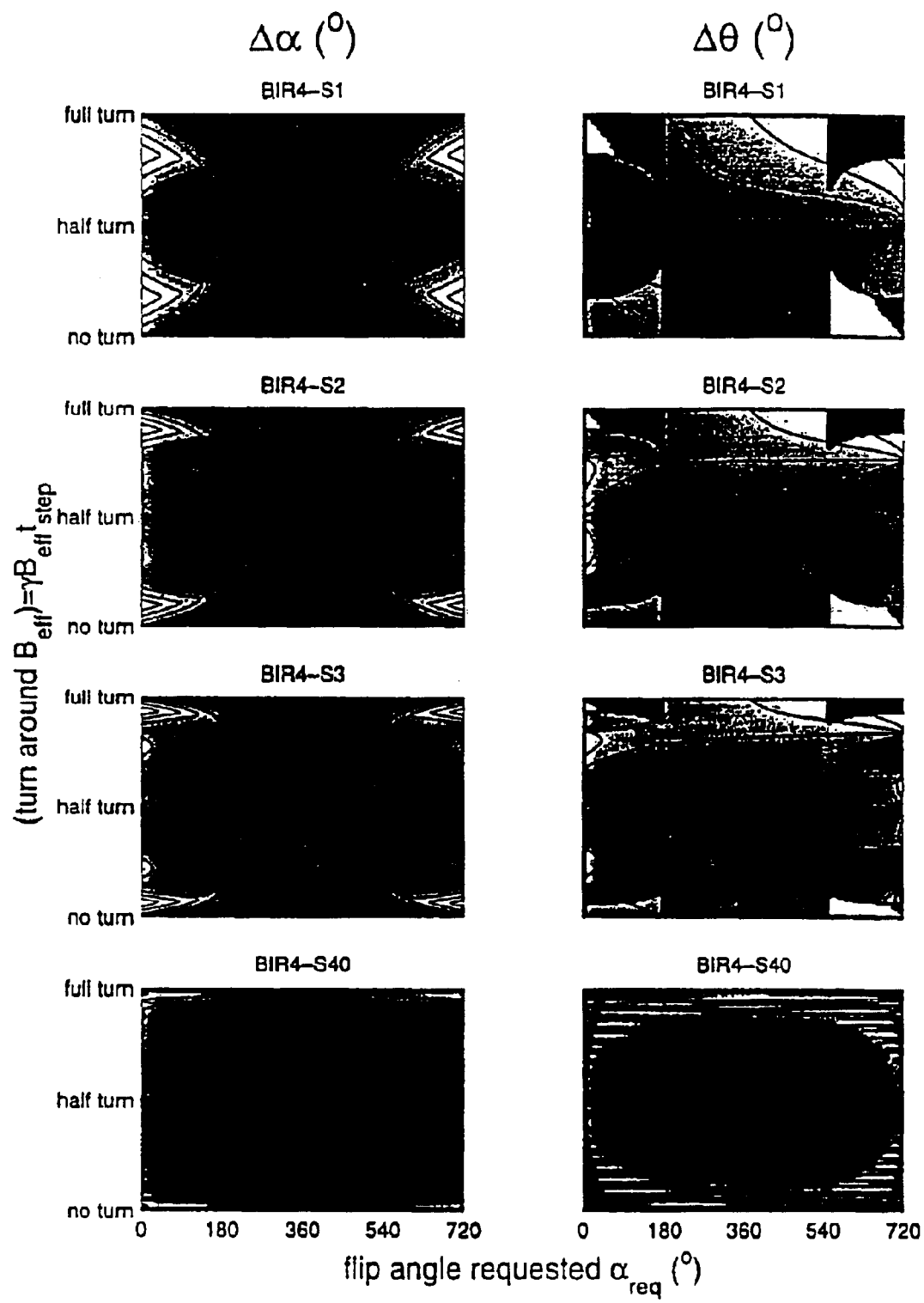
FIG. 8 illustrates the results of the simulation for the case $B_1=B_{1ref}$ without any $B_0$ defects for the four pulses BIR-4-S1, 2, 3 and 40, testing the time of application from no turns to a full round around each $\vec{B}_{eff}$ step. $\Delta\alpha$ and $\Delta\theta$ are presented as defined in table 2. The grey scale goes from −180° for the darkest to 180° for the lightest tone. The black lines mark the −135°, −90°, −45°, −5°, 5°, 45°, 90° and 135° level.

As expected, we see in FIG. 8 that the difference between the results obtained by our BIR-4-Si and the theoretical flips are minimised in the region of the half turn for the time axis and at the point 360° on the flip angle axis.

We also see that, for an increasing number of steps, the minimised zone increases at the cost of an increasing total time of application. For example, at the maximum RF power available, one half-turn step is done in approximately 250 $\mu$s. This translates to a 1 ms pulse for BIR-4-S1 and 40 ms for BIR-4-S40.

Figure 9:
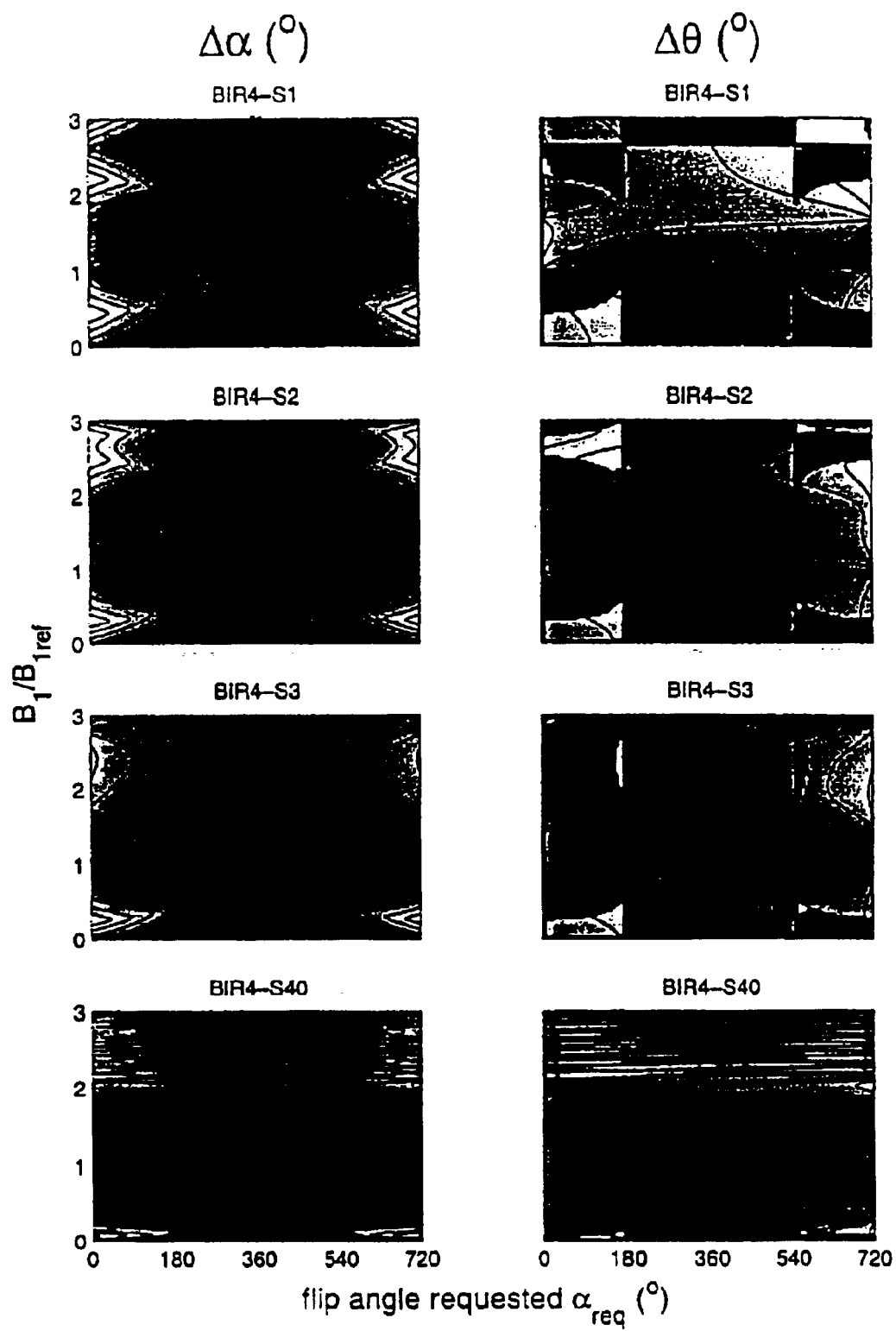
FIG. 9 illustrates the results of the simulation for the case $\gamma B_{eff} t_{step}=\pi$ (at $B_1=B_{1ref}$) without any $B_0$ defects, for the four pulses BIR-4-S1, 2, 3 and 40, testing the amplitude of $B_1$ from 0 to three times the reference amplitude $B_{1ref}$. $\Delta\alpha$ and $\Delta\theta$ are presented as defined in table 2. The grey scale goes from −180° for the darkest to 180° for the lightest tone. The black lines mark the −135°, −90°, −45°, −5°, 5°, 45°, 90° and 135° level.

At the second level of optimisation, we simulate a variation of $B_1$ from 0 to $3B_{1ref}$. The application time for each step t(j) was chosen to permit a half-turn of the magnetisation around $\vec{B}_{\mathit{eff}}$ for the case $B_1 = B_{1ref}$. This second simulation is closer to reality, where the timing is predetermined and the $B_1$ field may vary in space from one area to another. These results are presented in FIG. 9. No graphs are presented for $\Delta\phi$ which is less than 0.001° throughout.

We see from these results that for an $\alpha_{req}$ around 360° (180° to 540°) and for a $$\frac{B_1}{B_{1\,ref}}$$

from about 0.75 to 1.75, the difference between $\alpha$ obtained and $\alpha_{req}$ requested is less than 5°. This is more than adequate since, for a head coil, the variation of $B_1$ inside the middle axial slice is about 25% (see FIG. 13). For $\Delta\theta$, we see that it is near 0° around $$\frac{B_1}{B_{1\,ref}}$$

=1 for almost all $\alpha_{req}$. And for the workable zone of $$\frac{B_1}{B_{1\,ref}}$$

$\in[0.75: 1.75]$, $\alpha_{req} \in [180°: 540°]$, $\Delta\theta$ goes as high as 80° for BIR-4-S1. This would mean that, for an extreme case with a fluctuation of 25% of $B_1$ over 10 cm and for voxels of 5×5×5 mm, the dephasing within the voxel is less than 10°, resulting in a negligible loss of signal for most applications.

Again, we have not presented any graphs for $\Delta\phi$ since its maximum value is less than 0.001°. No notable rotation of the 3D magnetisation around $\vec{m}_1$ is induced by our pulse for all $$\frac{B_1}{B_{1\,ref}}$$

and $\alpha_{req}$ simulated.

At the last level of optimisation, we simulated the effect of a slice-selective gradient or $B_0$ inhomogeneity on the pulse. We use $B_1 = B_{1ref}$ and the application time t(j) to obtain a half-turn rotation around $\vec{B}_{\mathit{eff}}$ before adding a $B_0\hat{z}$ component in the range $-2B_{1ref}$ to $2B_{1ref}$.

Figure 10:
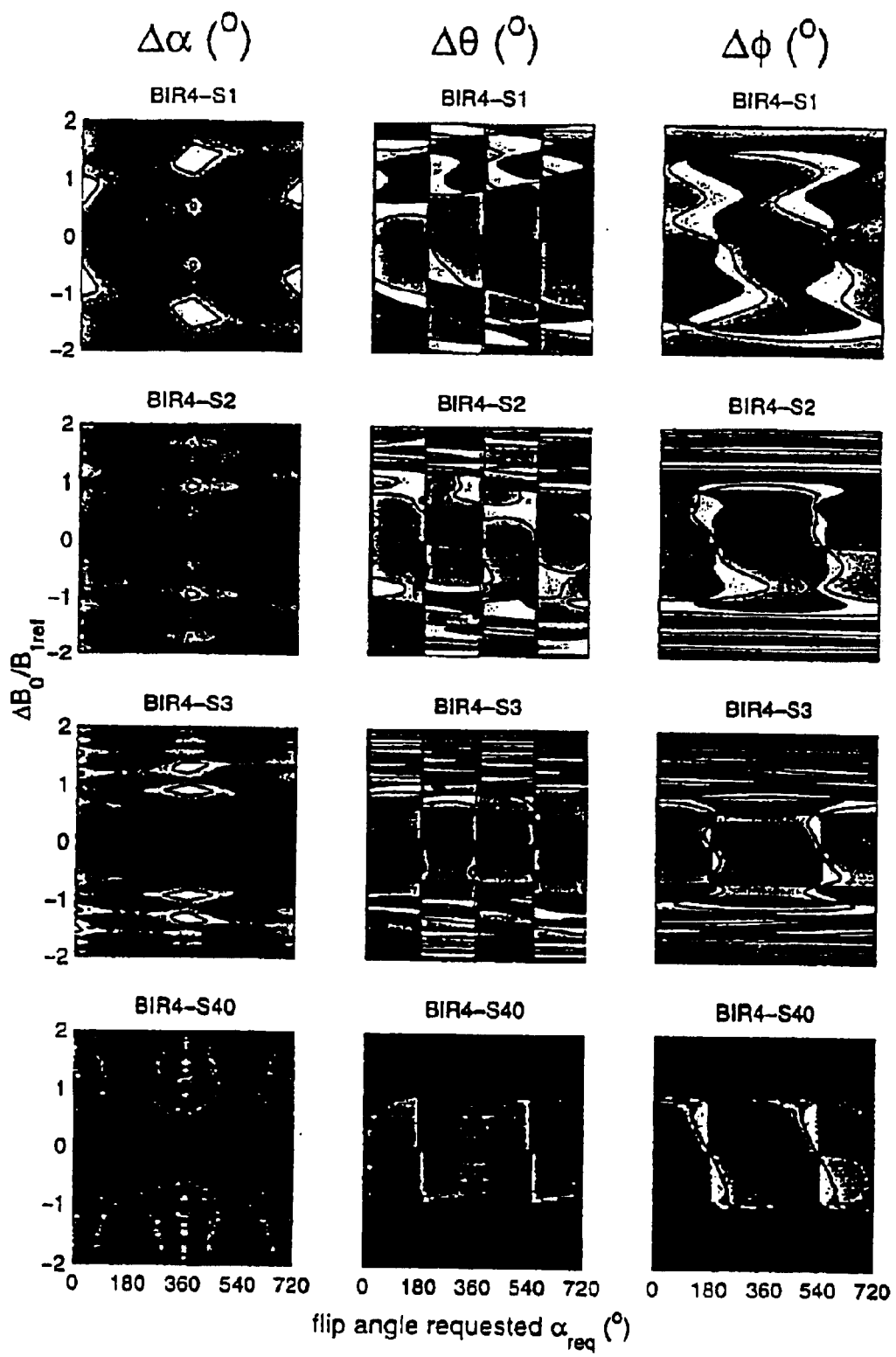
FIG. 10 illustrates the results of the simulation for the case $\gamma B_{eff} t_{step}=\pi$ (at $\Delta B_0=0$) and $B_1=B_{1ref}$ for the four pulses BIR-4-S1, 2, 3 and 40, testing $B_0$ defects from −2$B_{ref}$ to 2$B_{1ref}$. $\Delta\alpha$, $\Delta\phi$ and $\Delta\phi$ are presented as defined in table 2. The grey scale goes from −180° for the darkest to 180° for the lightest tone. The black lines mark the −90°, −5°, 5° and 90° level.
Figure 11:
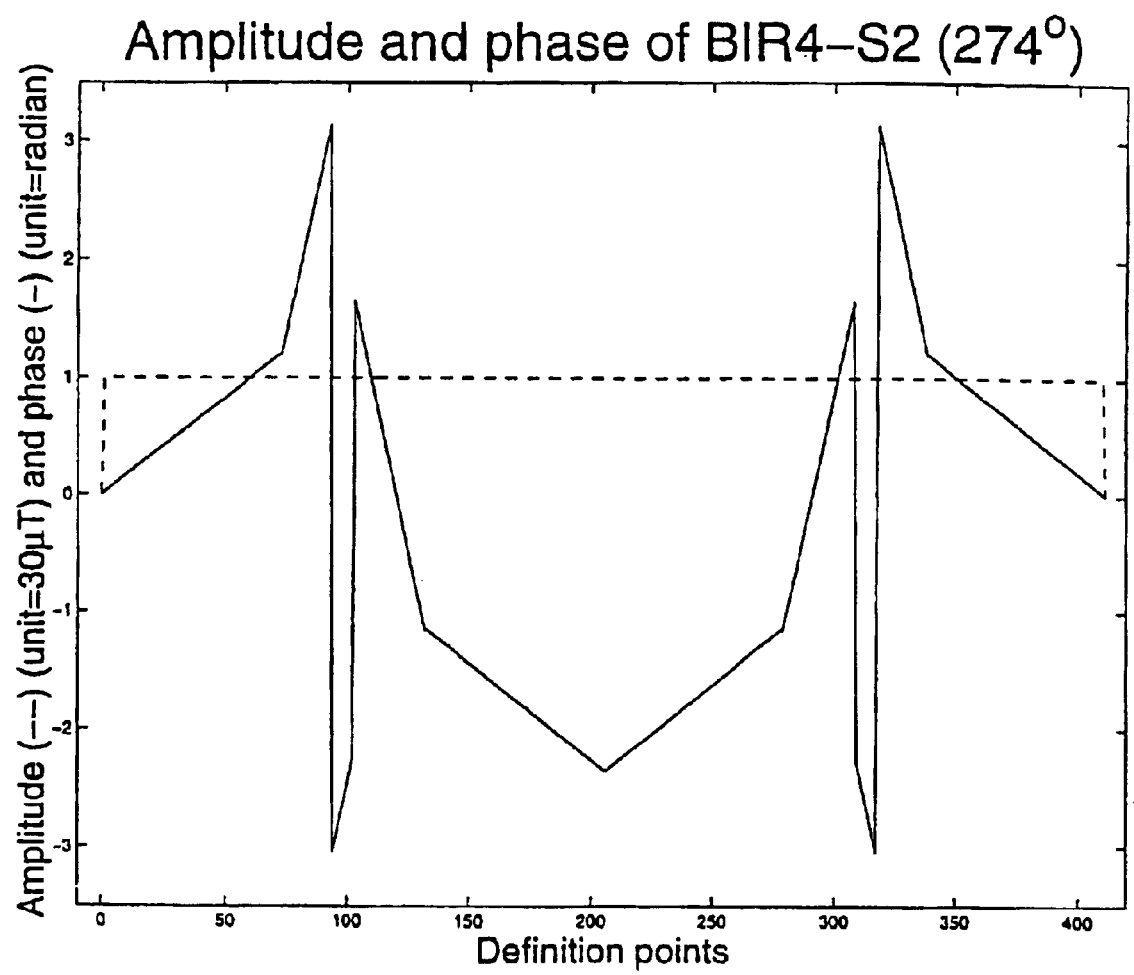
FIG. 11 shows a diagram of the amplitude (dashed line) in $B_{1ref}$ unit and phase (continuous line) in radian of a BIR-4-S2 (274° of 412 points of 5 µs duration each, for a $B_{1ref}$ of 30 µT.

It can be seen from FIG. 10 that our RF pulse is sensitive to large $B_0$ inhomogeneity (i.e. slice-selective gradients). In the case of BIR-4-S40, where the pulse is similar to a true adiabatic pulse due to the high number of steps, near $\Delta B_0 \approx B_{1ref}$ a transition occurs and, for $$\left|\frac{\Delta B_0}{B_{1ref}}\right| \geq 1,$$

the magnetisation is spoiled. This means that BIR-4-S40 is slice-selective. For BIR-4-S1 to S3 the effect of a $B_0$ inhomogeneity is much less and we do not have a transition as in the BIR-4-S40 which would be necessary to obtain slice selection. The effect of a poorly shimmed $B_0$ will somewhat compromise the quality of the pulse. The use of a maximal $B_1$ intensity will minimise the effect of $B_0$ inhomogeneity by reducing the $$\frac{\Delta B_0}{B_{1ref}}$$

ratio.

For example, with a $\Delta B_0$ of 10% of $B_1$ (easily obtained with good shimming over a large volume), $\Delta\alpha$ is kept within 5°.

These results show that our pulse is largely insensitive over $B_1$, must be used with proper shimming and should be considered for 3D applications only.

Materials and Methods

To validate our simulation, we implemented a simple 2D gradient echo sequence on a 1.5T Magnetom Vision (Siemens AG, Erlangen) in which we modified the RF pulse for each of our tests. The parameters $T_R$=2000 ms and $T_E$=10 ms were chosen to accommodate a long rectangular (50× 20×10 cm) phantom with smooth edges filled with a water solution of $T_1 \approx 300$ ms. This was placed longitudinally to $\vec{B}_0$ field into a head coil, and we obtained a shimming within an offset of 600 nT/m.

First test, $B_1$ mapping. The sequence is used with a standard slice-selective sinc RF pulse for a range of RF powers to produce a series of images. From those images, we determined, for each pixel, the relative RF amplitude needed to obtain a true 180° (i.e. to obtain the minimum pixel intensity through the series). This mapping has been included in the simulated model presented with the data.

Second test, flip angle. For this test, we used the BIR-4-S2 RF pulse without slice-selective gradients. Pulse duration was 2 ms with a discretisation of 5 μs (412 points) and a $B_{1ref}$ amplitude of 30 μT (FIG. 8). We sampled the signal at each 10° from 0° to 720°. A 3D acquisition was used with one partition only, the thickness being in the minor axis of the phantom. This test was used to corroborate the efficiency of the pulse.

Third test, $B_1$ intensity effect. In this test we used a BIR-4-S2 pulse with a flip angle of 274°, without slice-selective gradients. This angle corresponds to a flip of −90° relative to the symmetrical pulse of 360°, plus a systematic shift of 4° as described in the next section. The pulse duration was 4 ms with discretisation at each 5 μs (824 points) and the range of $B_1$ amplitude was from 0 to 30 μT with the $B_{1ref}$ set at 15 μT. The data acquisition method was similar to that of the second test.

This sequence was sufficient to test the longitudinal ($\hat{z}$) magnetisation, while for the transverse plane, we preceded the BIR-4-S2 pulse with an AHP pulse to flip the magnetisation to the $\hat{x}$ or $\hat{y}$ axis.

Figure 12:
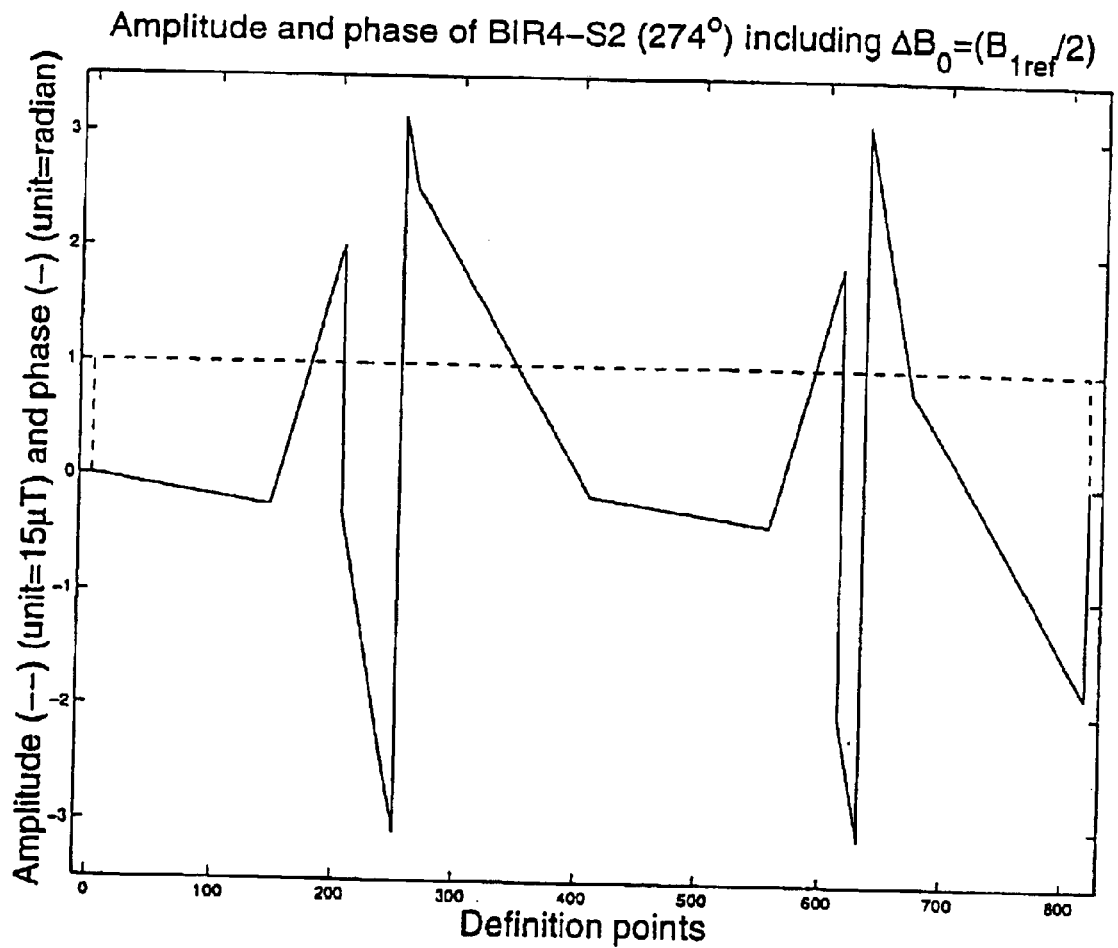
FIG. 12 shows a diagram of the amplitude (dashed line) in $B_{1ref}$ unit and phase (continuous line) in radian for a BIR-4-S2 (274°) including a $B_0$ defect ($\Delta B_0=B_{1ref}/2$) over 824 supported points applied 5 µs each for a $B_{1ref}$ of 15 µT.

Fourth test, $B_0$ inhomogeneity effect. This last test was similar to the third, with an additional constant longitudinal ($B_0\hat{z}$ equivalent) component incorporated into the definition of the BIR-4-S2 (272°) pulse. The $B_0$ equivalent components covered the range −0.75 μT to 30 μT with the pulse always defined with a $B_{1ref}$ of 15 μT. The $\hat{x}$, $\hat{y}$ and $\hat{z}$ axis components were tested. FIG. 12 presents the form of one of the modified pulses at $\Delta B_0$=7.5 μT.

Results

The following general statements should be kept in mind concerning the testing:

The standard deviation of the statistical errors of the measurements is less than the size of the "+" symbol used in the graphs.

We have not taken into account probable systematic errors due to $B_0$ inhomogeneity, long $T_1$ components, eddy currents, discretisation or transmitter effects.

The fit of the model for the third and fourth result series takes into account the $B_1$ distribution over the volume of interest (VOI) used in the measurement.

The amplitude of the signal in the second to fourth tests is determined from the $\hat{z}$ magnetisation test only (FIG. 15c).

Figure 13:
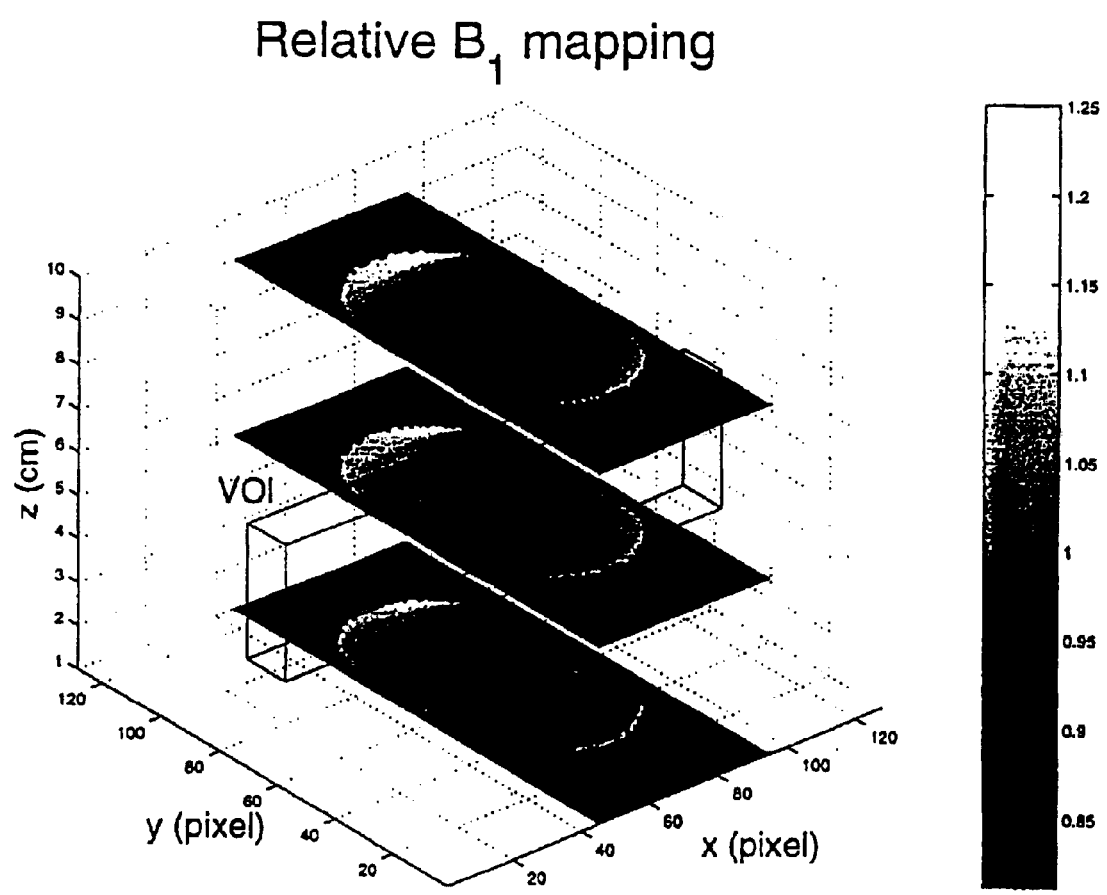
FIG. 13 illustrates $B_1$ mapping of a smooth rectangular phantom (50×20×10 cm) placed in a head coil with the major axis along the $B_0\hat{z}$ main magnetic field. The distribution is relative to the middle of the volume of interest (meshbox) and goes from 0.8 (darkest) to 1.25 (lightest) of relative RF amplitude.

First test, B1 mapping. FIG. 13 presents three transversal slices (10 mm thick) of $\partial B_1$ of the phantom placed into the head coil. The range of $\partial B_1$ goes from 0.8 in the darkest zone of the phantom to 1.25 for the lightest. The $\partial B_1$ data is used to estimate the value of the model in the third and fourth test.

The shoe box (30×30×400 mm) in the figure represents the volume of interest that is used for the other tests. This box represents 10×10 pixels of a sagital slice (y-z plane) that integrates the signal from the phantom 100 mm thickness (x axis) when the 3D RF pulse is used.

Figure 14:
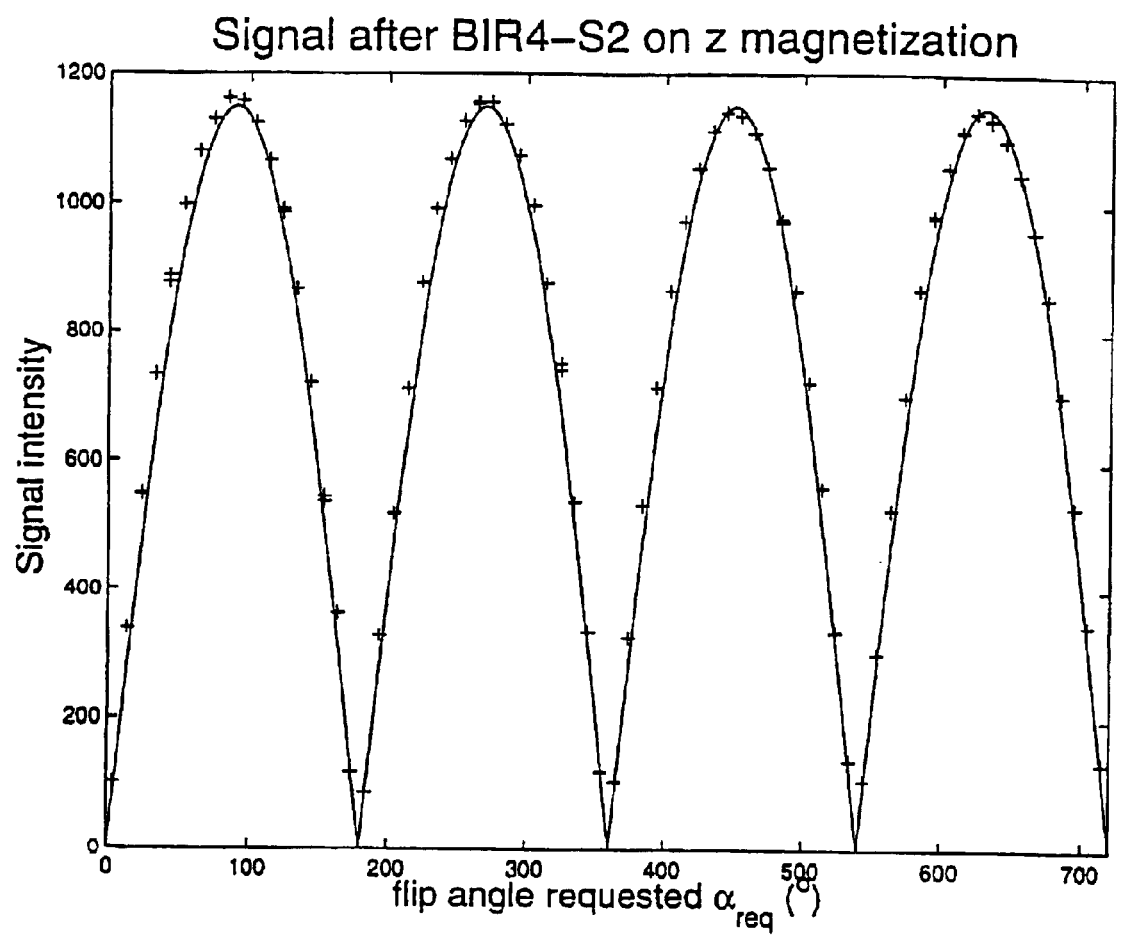
FIG. 14 illustrates the signal amplitude obtained from a BIR-4-S2 (412 points, total application time of 2.06 ms, $B_1$ amplitude of 30 µT) for a requested flip angle ($\alpha_{req}$) in the range 0° to 720°. The continuous line represents the absolute value of a sine function with a previously adjusted amplitude. A 4° systematical shift correction has already been applied.

Second test, flip angle. FIG. 14 presents the results of a BIR-4-S2 (2 ms, 412 points) for an α in the range 0° to 720°. We see a good agreement between the measurements and the absolute value of a sine function. We found a 4° systematic shift which has been corrected for in all the measurements. We have found that this offset was due to the discretization of the pulse and is inversely proportional to the number of points defining the pulse:

$$\text{Offset} = \frac{4° \times 412 \text{ pts}}{\# \text{ pts}} \quad (11)$$

More precisely, since the RF pulse is composed of amplitude and phase points that are applied in 5 μs steps, systematic effects accumulates depending on the interpolation method used between each point. One particular concern for the BIR-4 pulse is the large phase jumps at the end of the first and third quarters which are very important to the definition of the flip angle. Any defects in these jumps will modify the resulting flip angle.

Figure 15:
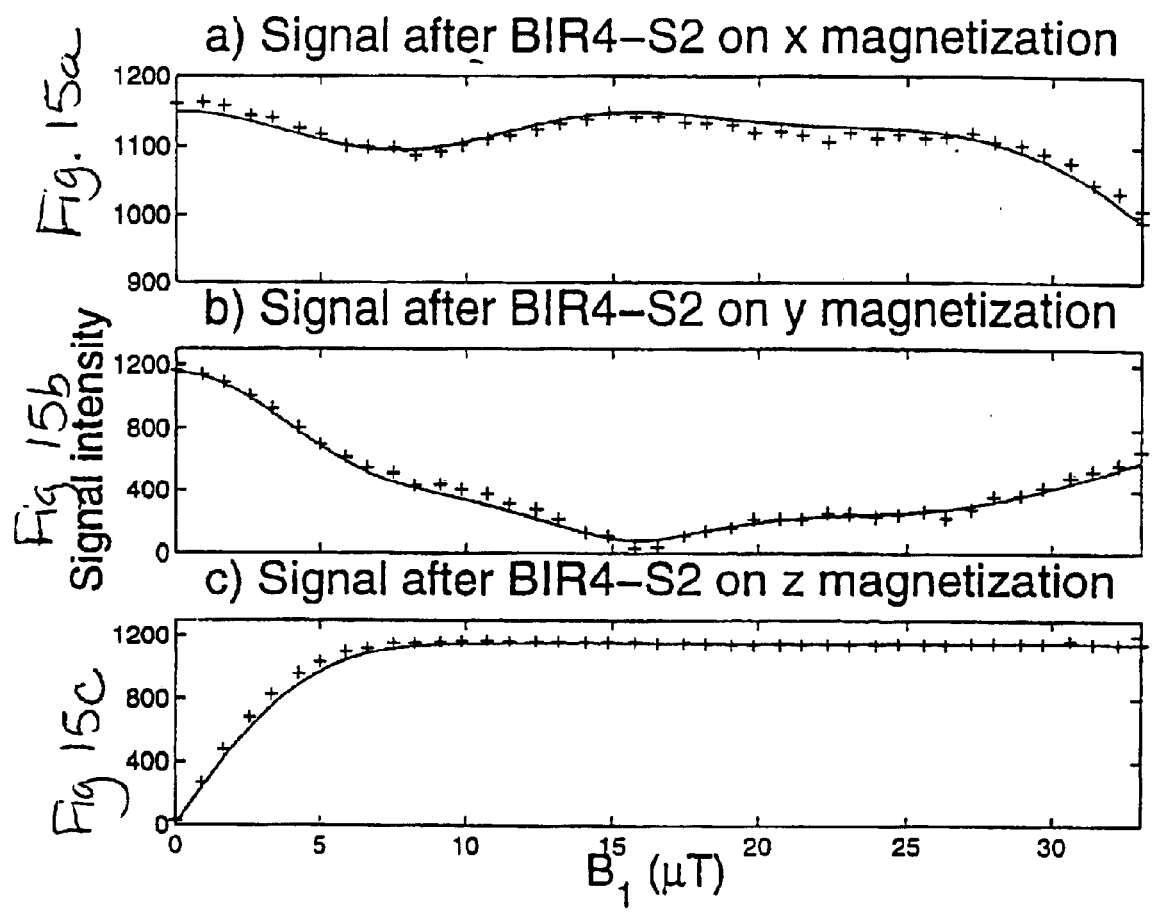
FIGS. 15a–15c illustrate the signal amplitude obtained by a BIR-4-S2 ($\alpha_{req}=274°$, 824 points, application time of 4.12 ms, calibrated amplitude $B_{1ref}$ of 15 µT) on a $B_1$ range of 0 to 30 µT, flipping a magnetization initially aligned with the $\hat{x}$ axis, FIG. 15a, $\hat{y}$ axis, FIG. 15b and $\hat{z}$ axis, FIG. 15c. The continuous line represents the corresponding simulation including the $B_1$ distribution effect through the VOI.

Third test, $B_1$ intensities effect. FIG. 15 shows the intensity of the signal produced by a BIR-4-S2 (4 ms, 824 points, 272° flipped from $\hat{z}$ to $\hat{y}$ with the initial magnetisation along the a) $\hat{x}$ axis, b) $\hat{y}$ axis and c) $\hat{z}$ axis. Except for some small discrepancies, we find a good agreement between the model and the measurements. For the $\hat{x}$ and $\hat{y}$ magnetisation produced by an AHP, the RF transmitter seems to give less power than for the $\hat{z}$ case where no RF pulse is used prior to the BIR-4-S2. This small systematic effect could be due to a variation of the transmitter response to the different measurement conditions and relaxation during excitation.

Figure 16:
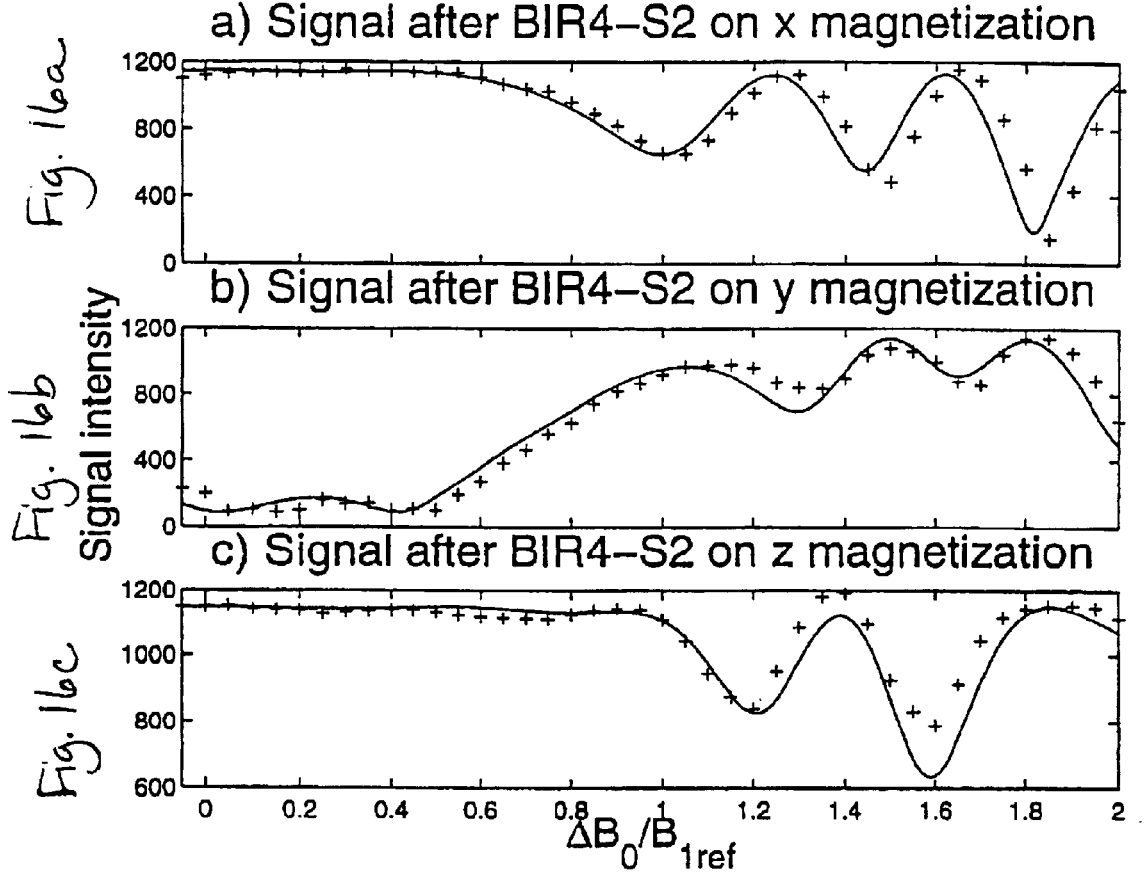
FIGS. 16a–16c illustrate signal amplitude obtained by a BIR-4-S2 ($\alpha_{req}=274°$, 824 definition points, application time of 4.12 ms, with the calibrated amplitude $B_1=B_{1ref}$ of 15 µT), used with a $B_0$ defect going from −0.75 µT to 30 µT acting on magnetization initially aligned with the $\hat{x}$ axis, FIG. 16a, $\hat{y}$ axis, FIG. 16b and $\hat{z}$ axis, FIG. 16c. The continuous line shows the corresponding simulation including the $B_1$ distribution effect through the VOI and the $B_0$ defect.

Fourth test, $B_0$ intensity effect. FIG. 16 shows the results obtained by the measurement of the signal intensity with a BIR-4-S2 which includes a $B_0$ shift (4 ms, 824 points, 272° from $\hat{z}$ to $\hat{y}$. The initial magnetisation is aligned with the a) $\hat{x}$, b) $\hat{y}$ and c) $\hat{z}$ axis. The simulation includes the $B_1$ distribution effect. In general, the data follows the shape of the curve produced by the model. We associate most of the differences between simulation and data to discretisation effects and, as previously, to RF transmitter effects and relaxation during excitation.

Discussion

In general, the measured data correspond well to the simulation for the case BIR-4-S2 at 272°.

We were unable to evaluate two potential causes for the small disagreements between the measured data and the model: how the response of the transmitter system affects its performance and the intensity of the eddy currents due to the RF itself. Either these factor could modify the design of the RF pulse and its properties.

Two other causes of disagreement should be mentioned. $B_0$ inhomogeneity, as seen in the fourth test result, becomes important when higher than $B_{1ref}$, as might be the case for large field of view (FOV). With the Siemens' MRI system, $B_{1ref}$ can be as high as 30 μT while the standard offset after shimming is less than 3 μT (2 ppm rms for 50 cm sphere). For our tests, the shimming offset was in the order of 0.04

μT (0.05 ppm rms for 10 cm sphere) and thus negligible. Finally, long $T_1$ compounds may be present in our phantom but have been neglected and only the main $T_1$ of 300 ms has been considered and a $T_R$ of 2000 ms has been chosen as being sufficient to compensate for systematic $T_1$ effects.

The advantages of the adiabatic pulses converted with our concept are a reduced SAR $$\left(\frac{SAR_{BIR-4-S1}}{SAR_{BIR-4}} = \frac{1}{20}\right)$$

a reduced application time $$\left(\frac{\tau_{BIR-4-S1}}{\tau_{BIR-4}} = \frac{1\,\text{ms}}{32\,\text{ms}}\right)$$

and an adiabatic quality pulse.

Conversely, two disadvantages to this method should be considered: the loss of slice selectivity and that an adequate shimming must be achieved.

CHAPTER 2—TOMROP-Look-Locker T1 Mapping Using the New BIR-4-S2 RF Pulse

Introduction

The measurement of parameters such as $T_1$, $T_2$ and the apparent diffusion coefficient is becoming more and more popular in the magnetic resonance imaging field. While $T_1$ weighted images are commonly used in radiological diagnostics, quantitative $T_1$ mapping images can be a powerful tool in post-processing analysis.

In this chapter, we present results obtained by a TOMROP-Look-Locker sequence using the new BIR-4-S2 RF pulse we developed as compared to the standard rectangular RF pulse. The TOMROP-Look-Locker sequence is an efficient $T_1$ mapping sequence but is, as are other $T_1$ mapping techniques, highly sensitive as to the precision of the imager's flip angle. For standard RF (rectangular, sinc) pulses the flip angle obtained is directly proportional to the $B_1$ field produced by the antenna. In a head coil the $B_1$ field can be distributed over a large range (21% to –50% [FIG. 18f]) from the reference field. The $T_1$ value calculated from the data obtained by such flip angles can be under-estimated by up to 65% (FIG. 18e). Thus the use of the new pseudo-adiabatic BIR-4-S2 RF pulse, which is insensitive over a large range of $B_1$, can improve the TOMROP-Look-Locker sequence without unduly increasing the application time or specific absorption rate (SAR).

Theory

Figure 17:
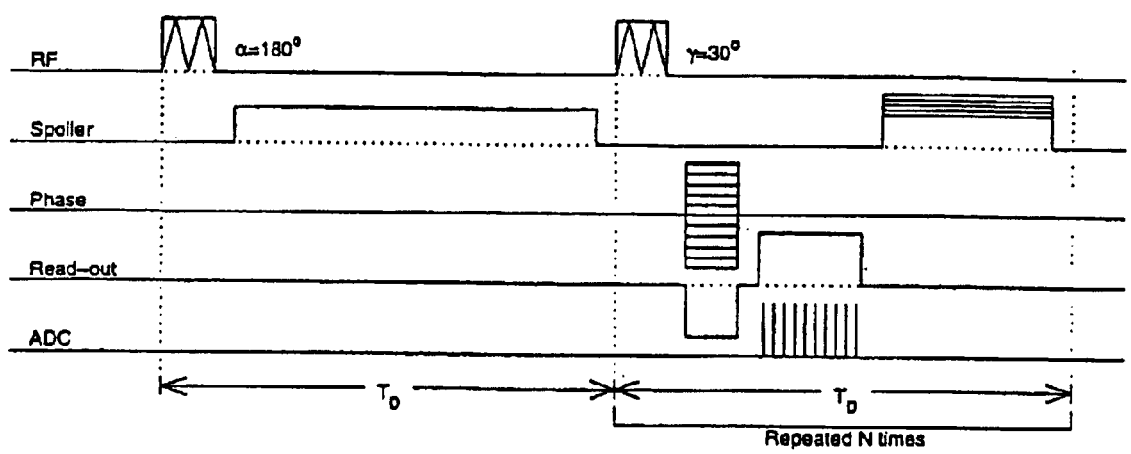
FIG. 17 illustrates the TOMROP-Look-Locker sequence diagram. The RF pulses can be either rectangular or BIR- 4-S2 and are used without a slice-selective gradient. (Slice-selective RF pulse with slice-selective gradients could also be used). Throughout, N was set to 40 and the spoiler is in the slice-selective axis.

The TOMROP-Look-Locker sequence (FIG. 17) produces a signal $M_n$ (n≥1 representing the echo number) given by:

$$M_n = M_0 \sin\gamma e^{-\frac{T_D}{T_2}} \left( \frac{\left(1 - e^{-\frac{T_D}{T_1}}\right)\left(1 - \left(\cos\gamma e^{-\frac{T_D}{T_1}}\right)^n\right)}{1 - \cos\gamma e^{-\frac{T_D}{T_1}}} + \cos\alpha \frac{\left(\cos\gamma e^{-\frac{T_D}{T_1}}\right)^n}{\cos\gamma} \right) \quad (1)$$

and describes an inversion recovery sequence where the signal is measured many times by a γ RF pulse throughout the recovery process.

The measured data are fitted to extract the $T_1$ value for each pixel using MINUIT. The equation used is:

$$M_n = \left| M \left( \frac{\left(1 - e^{-\frac{T_D}{T_1}}\right)\left(1 - \left(\cos\gamma e^{-\frac{T_D}{T_1}}\right)^n\right)}{1 - \cos\gamma e^{-\frac{T_D}{T_1}}} + \cos\alpha \frac{\left(\cos\gamma e^{-\frac{T_D}{T_1}}\right)^n}{\cos\gamma} \right) \right| \quad (2)$$

where M and $T_1$ are the variables to be fitted, $T_D$, α and γ are the sequence parameters (considered exact) and $M_n$ is the measured data (associated with a statistical noise $\sigma_n$).

We consider a uniform additive normal noise of mean 0 and standard deviation $\sigma_n$ for each image. The probability distribution of that noise is:

$$p_n(I) = \frac{1}{\sigma_n \sqrt{2\pi}} e^{-\frac{I^2}{2\sigma_n^2}} \quad (3)$$

where I is the intensity of the noise in a pixel.

The standard deviation $\sigma_n$ of the noise has been determined by selecting a zone of the image where there is no signal. In that zone, knowing that what we have is the absolute value of the signal, the mean intensity will be:

$$\mu = \int_{-\infty}^{\infty} |I| p_n(I) dI = \sigma_n \sqrt{\frac{2}{\pi}} \quad (4)$$

thus, $$\sigma_n = \sqrt{\frac{\pi}{2}} \mu \quad (5)$$

We can now easily relate the mean of a zone of the image outside the object to the noise present in that image.

It should be noted that we have not considered the systematic noise that can be present in or out of the object zone of the image. The user is encouraged to ensure that no systematic noise is present in the "noise zone" and to take into account the fact that the standard deviation of the noise excludes the systematic noise present in the object zone of the image arising from the hardware and/or the sequence.

The standard deviation of $T_1$, $\sigma_{T1}$, obtained by the MINUIT procedure is scaled by a $$\sqrt{\frac{\chi^2}{DF}}$$

factor. Here, DF is the degree of freedom of the fit and is defined by N-$N_{para}$, where N is the number of data items and $N_{para}$, is the number of fitted parameters ($MT_1$).

To study the sensitivity of the fitted $T_1$ over the fluctuation of the $B_1$ field, we simulated the four possible combinations of the RF pulses for α and γ with BIR-4-S2 and rectangular RF pulse. The simulated data are produced with equation 1 and fitted with the same equation and all $\sigma_n$=1. When the BIR-4-S2 RF pulse is used, the flip angle is considered exact. For rectangular RF pulse, the flip angle is multiplied by a $B_1$ relative factor (see FIG. 18f). FIG. 18e presents results of the simulation for the same parameters used in the experiment and for a theoretical $T_1$ of 300 ms.

Materials and Methods

We programmed the TOMROP-Look-Locker sequence (FIG. 17) on a 1.5T Magnetom Vision (Siemens AG, Erlangen). The parameters chosen were: $T_D$=62 ms, N=40 and $T_R$=648 ms. The $T_R$ was set to allow a delay of 4 seconds between the last echo and the next repetition. This ensures a good relaxation for long $T_1$ and gives time for the dissipation of energy in order to respect SAR limits.

A smooth rectangular phantom (50×20×10 cm) was used in a head coil with the major axis along the $B_0 \hat{z}$ main magnetic field and the minor axis normal to the sagital slice. The phantom was filled with a water solution of $T_1 \approx 300$ ms (table 3). The four combinations tested were:

| a) | $\alpha$ = BIR-4-S2 (540°) | and | $\gamma$ = BIR-4-S2 (390°); |
|---|---|---|---|
| b) | $\alpha$ = BIR-4-S2 (540°) | and | $\gamma$ = rectangular (30°); |
| c) | $\alpha$ = rectangular (180°) | and | $\gamma$ = BIR-4-S2 (390°); |
| d) | $\alpha$ = rectangular (180°) | and | $\gamma$ = rectangular (30°) |

These four tests permitted us to corroborate the simulation of the effect of $B_1$ over the fitted $T_1$. For this, a $B_1$ mapping of the imaged zone was performed. A gradient echo sequence was used with a standard rectangular RF pulse on a range of RF powers to produce a suite of images. From those images, we determined, for each pixel, the relative RF amplitude needed to obtain a true 180° (i.e. to obtain the minimum pixel intensity through the suite).

Results

FIG. 18f presents the sagital $B_1$ mapping of the head coil onto the phantom. We see that the relative range of $B_1$ goes from 0.5 for the head and feet areas to 1.21 for the anterior and posterior areas. The field of view shown is 240×240 mm.

The results of the simulation appear in FIG. 18e. Two major observations can be seen from the graph:

First, $T_1$ is largely under-estimated with the use of a rectangular $\alpha$ (180°) RF pulse, whatever the pulse used. The $T_1$ underestimation is about 25% for a relative $B_1$ of ±25% from the reference $B_1$.

Second, $T_1$ is slightly mis-estimated when using the BIR-4-S2 pulse for the (180°) RF pulse and a rectangular $\gamma$ (30°) RF pulse. The $T_1$ mis-estimation is about $\mu$3% for a relative $B_1$ of ±25% from the reference $B_1$.

The use of both a rectangular $\alpha$ and $\gamma$ pulse combines the two effects of mis-estimation of $T_1$ as compared to the perfect case when both pulses are BIR-4-S2.

FIGS. 18a to 18d present the four TOMROPFLook-Locker $T_1$ mapping tests, corresponding to the $B_1$ mapping shown in FIG. 18f and corroborate the simulation shown in FIG. 18e.

18a: $\alpha$=BIR-4-S2 (540°) and $\gamma$=BIR-4-S2 (390°). This is the most precise case where all the flip angles are independent of $B_1$. We see a very good uniformity across the sagital slab into the head coil. The only disadvantage of this combination is that we are limited to a 3D acquisition due to the non-slice-selectivity of the new pulse.

The $T_1$ values vary from about 289 ms to 314 ms for all regions of the slice. At the center of the image, the $T_1$ value is 304 ms with a standard deviation of 1.4 ms.

18b: $\alpha$=BIR-4-S2 (540°) and $\gamma$-rectangular (30°). This is the most convenient combination of RF pulses. The use of $\alpha$=BIR-4-S2 (540°) maintains a good precision for the value of $T_1$ (see simulation FIG. 18e) and the $\gamma$=rectangular (30°) permits a 2D acquisition since the rectangular RF pulse can be easily replaced by a slice-selective sinc RF pulse.

The $T_1$ values vary from about 266 ms to 337 ms throughout the mapping and, at the centre of the image, the $T_1$ value is 296 ms with a standard deviation of 0.9 ms.

18c: $\alpha$=rectangular (180°) and $\gamma$=BIR-4-S2 (390°). This is not a likely scenario. The $\alpha$=rectangular (180°) at the beginning of the sequence compromises the precision of the mapping, and the $\gamma$=BIR-4-S2 (390°) does not permit a slice selectivity and increases the SAR.

The $T_1$ values range from approximately 120 ms to 311 ms throughout the image and the value at the centre is 302 ms with a standard deviation of 1.4 ms.

18d: $\alpha$=rectangular (180°) and $\gamma$=rectangular (30°). This is the standard RF set-up when no adiabatic or pseudo-adiabatic pulses are available. The precision of the mapping is lost throughout the coil due to the use of $\alpha$=rectangular (180°). The acquisition can be 2D with the use of a sinc pulse instead of the $\gamma$=rectangular (30°).

The $T_1$ values fluctuate from about 134 ms to 300 ms throughout the mapping. At the center of the image, the $T_1$ value is 294 ms with a standard deviation of 1.1 ms.

Discussion

The use of RF pulses giving precise flip angles to the magnetisation in the TOMROP-Look-Locker sequence, as does the BIR-4-S2 RF pulse, greatly improves the accuracy of the $T_1$ mapping. With only the a pulse being very precise, the $T_1$ value of a mapping into a head coil could then have less than 12% of systematic error. With both the $\alpha$ and $\beta$ pulses being BIR-4-S2, the maximum systematic error of the $T_1$ mapping into the head coil is less than 5%. This compares to the systematic error of 55% obtained with the $\alpha$ and $\beta$ pulses being rectangular.

Though the use of a BIR-4-S2 RF pulse for both $\alpha$ and $\beta$ increases the SAR, the level stays low enough to respect clinical limits. This is a definite advantage of the sequentialisation of the adiabatic BIR-4 pulse which, in its original form, gave a higher SAR and imposed a longer scanning time to allow for this energy to dissipate.

A disadvantage of using a BIR-4-S2 RF pulse for the $\beta$ flip is the lack of slice selectivity. The BIR-4-S2 is intrinsically a 3D pulse, so a 3D acquisition must be used. For a 2D acquisition, the most convenient RF combination is a BIR-4-S2$\alpha$ and a slice selective sinc $\beta$. The maximum systematic error in this case is 12%, combined with a 2D acquisition, making this set-up the most practical.

Conclusion

The use of a new BIR-4-S2 RF pulse in the TOMROP-Look-Locker sequence greatly improves the accuracy of the $T_1$ mapping obtained without significantly increasing the total sequence duration or SAR.

CHAPTER 3: $T_1$ Mapping Using Compensated Stimulated Echoes and the New BIRA-S2 RF Pulse

Introduction

The measurement of parameters such as $T_1$, $T_2$ and the apparent diffusion coefficient is becoming more and more popular in the magnetic resonance imaging (MRI) field. While $T_1$ weighted images are commonly used in radiological diagnostics, quantitative $T_1$ mapping images can be a powerful tool for post-processing analysis.

In this chapter, we present a $T_1$ mapping technique which uses compensated stimulated echo (STE) amplitudes. The compensation is applied to the multiple STE sequence by modifying the flip angle for each echo to increase the signal exponentially in time. Thus, for a fixed $T_1$, the signal would be the same for all the STE and, for shorter or longer $T_1$, the signal will decrease or increase respectively as we go through the stimulated echoes. The set of echoes can easily be adapted for other $T_1$ by modifying the delay between the STE in the sequence.

Large $B_1$ inhomogeneities exist in standard clinical coils. For a head coil, a 25% difference in the $B_1$ intensity between the centre and the periphery is common. The $T_1$ mapping is sensitive to the systematic error on the flip angle induced by the $B_1$ inhomogeneities. To reduce this artefact, we are using the new BIR-4-S2 RF pulse we develop and which is largely insensitive to $B_1$ inhomogeneity. We have compared these results to those produced by a standard rectangular RF pulse.

Theory

To produce the data for $T_1$ mapping we use a multiple stimulated echo (STE) sequence following a spin echo. Each STE uses a fraction of the magnetisation, leaving the remainder of the magnetisation in the longitudinal plane and being subjected to spin-lattice relaxation.

Figure 19:
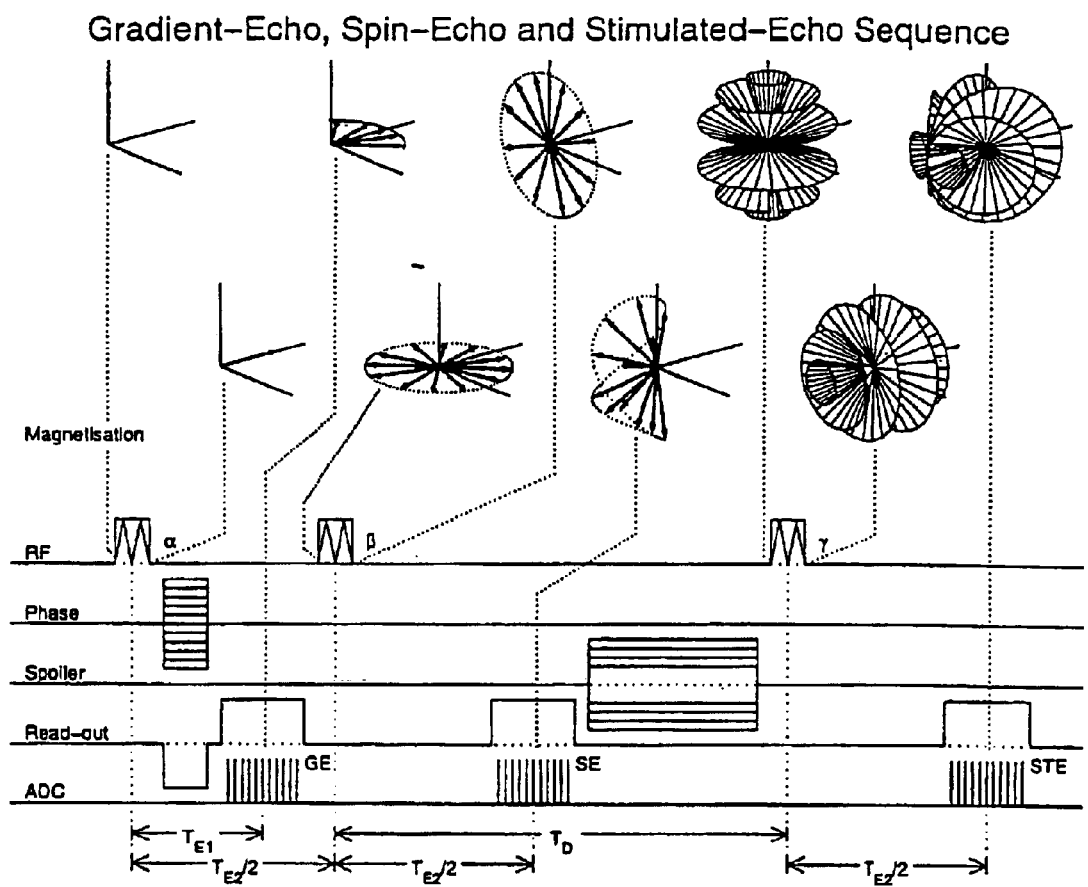
FIG. 19 illustrates the gradient-echo, spin-echo and simulated echo sequences in their simplest forms. This simplified sequence accompanies the description. The simplest simulated echo sequence, given in the theory section. The magnetization shown is produced by all 90° flip angles: $\alpha$, $\beta$ and $\gamma$.
Figure 20:
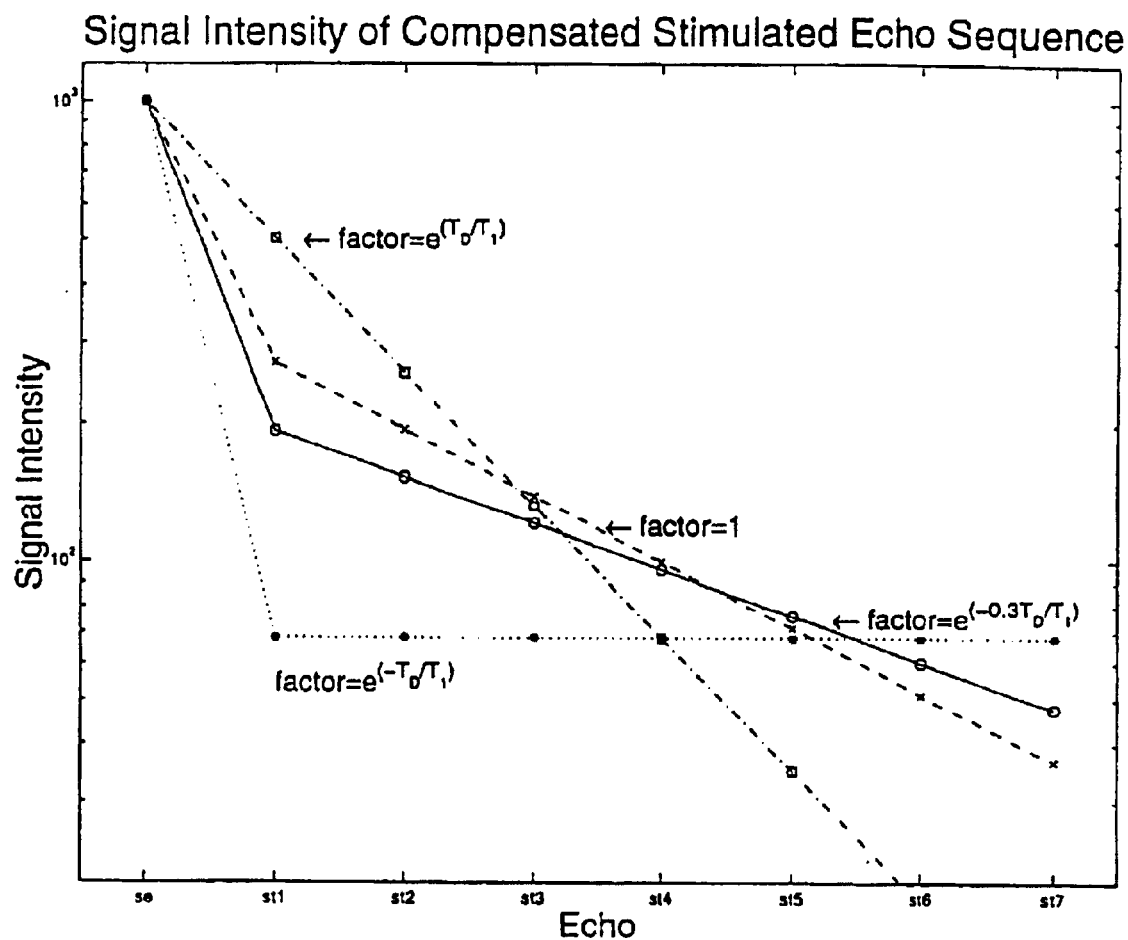
FIG. 20 illustrates the signal intensity produced by the compensated stimulated echo sequence for N=7 stimulated echoes with different compensation factors. factor=1 corresponds to no compensation as in the TART principle. The total compensation is shown for the factor=$e^{-T_0/T_1}$ and the compensation that we have used with factor=$e^{-0.3T_0/T_1^0}$. The simulation parameters are $T_D$=100 ms and $T_1$=300 ms as in the experiment.

The Simplest Stimulated Echo Sequence (FIG. 19)

Starting with a magnetisation at rest of magnitude $M_0$, we apply a first excitation with an alpha=90° RF pulse. At this time, the magnetisation is in the transverse plane and starts to relax in $T_2^*$, which is a combination of the $T_2$ relaxation (spin-spin) and the dephasing due to inhomogeneities, and in the $T_1$ (spin-lattice) relaxation. Since the times $T_{E1\ and\ TE2}$ are rather short compared to $T_1$, we shall neglect the small longitudinal magnetisation produced by the $T_1$ relaxation up to those times.

The $T_2^*$ relaxation decreases the residual magnetisation during the $TE_1$ interval by $$e^{\frac{-T_{E1}}{T_2^*}},$$

and the gradient echo (GE) which can be measured at $T_{E1}$. At that time, the intensity of the signal is given by:

$$I_{GE} = M_0 \sin\alpha e^{\frac{-T_{E1}}{T_2^*}} \quad (1)$$

During the $$\frac{T_{E2}}{2}$$

interval after the a pulse, the magnetic inhomogeneities will modify the phase of precession of each spin by an amount of $\delta(x,y,z)$, which is a function of the space co-ordinate. This effect will disperse the macroscopic magnetisation in the whole transverse plane. At the end of the $$\frac{T_{E2}}{2}$$

interval a β=90° RF pulse is applied.

At this point, we have a disk of magnetisation perpendicular to the transverse plane and, during a second time interval of $$\frac{T_{E2}}{2},$$

the spins gradually refocus to produce a spin echo (SE) at $T_{E2}$ after the α pulse, with the macro-magnetisation forming what is called a "ball-eight". Throughout, the signal continually decreases due to the $T_2$ relaxation. The intensity of the SE is:

$$I_{SE} = M_D \left( \frac{1-\cos\beta}{2} \right) \sin\alpha e^{\frac{-T_{E2}}{T_2}} \quad (2)$$

Following the SE, we apply a spoiler gradient which transforms the ball-eight into a sphere of magnetisation. That sphere is composed of an infinity of cones. All cones have their apex at the origin and are aligned along the z-axis. Due to the symmetry, a cone at angle δ is overlapped with the −δ cone. For this kind of geometry, we do not have any $T_2^*$ relaxation and the signal is only affected by the $T_1$ relaxation. We can leave the magnetisation in this state, relaxing for a time $T_{D1}$, and the signal intensity will decrease by a factor $$e^{\frac{-T_{D1}}{T_1}}.$$

During this time, the $T_1$ relaxation produces a non-negligible z-axis component of magnetisation and, after the next RF pulse, this component could produce a gradient echo. Throughout, we have a requirement that there are enough inhomogeneities to uniformly distribute the magnetisation around the z-axis in the time $$\frac{T_{E2}}{2}$$

and, this time, has the additional benefit of destroying the GE before it can interfere with the upcoming stimulated echo. If the inhomogeneities are not strong enough, an additional spoiling gradient could be applied after each RF pulse to produce the same effect.

A time $TD_1$ after the β pulse, we apply a final RF pulse with a flip angle $\gamma_1$=90°. Immediately after the $\gamma_1$ pulse, the cones start to refocus (by the δ(x,y,z) amount) and, $$\frac{T_{E2}}{2}$$

after the $\gamma_1$ pulse, the edge of all the cones are in focus to produce a STE. During the refocusing, since the $\gamma_1$ pulse made us lose the symmetry in the transverse plane, a $T_2$ relaxation occurs and the signal will be reduced by a factor $$e^{\frac{-T_{E2}}{2T_2}}.$$

$$I_{st_1} = M_0 \frac{1}{2} \sin\alpha\sin\beta\sin\gamma_1 e^{\frac{-T_{E2}}{T_2}} e^{\frac{-T_{D1}}{T_1}} \quad (3)$$

If we apply a spoiling gradient at this time (after a 90° RF pulse) all the inclined cones are transformed into disks with a conical section. The distribution of magnetisation over the disk is a convolution of the previous form over the new flip angle. This new distribution is symmetrical from the origin and all the magnetisation is annihilated. Since no signal can be produced after a 90° flip angle pulse, we always finish the series of STE by such a pulse to reduce unwanted artefacts.

Signal Produced with Multiple Stimulated Echoes

If we need more than one STE, the $\gamma_1$ flip angle must be less than 90°. After having obtained the first STE, a second spoiler (with a different amplitude from the first to prevent overlap of STE) is applied to transform the inclined cones into new cones similar in geometry and positioning but with the difference that they now have a thickness equal to $2\gamma_1$. This spoiler also has the effect, similar to the first spoiler just after the SE, of eliminating all the $T_2^*$ relaxation to occur after the $\gamma_1$ pulse. In this way, the magnetisation is in a similar state to the one that occurred just after the first spoiler and will experience a $T_1$ relaxation during a time $T_{D2}$ until we apply a new RF pulse $\gamma_2$. From this last pulse, the cones start to refocus again and at $$\frac{T_{E2}}{2}$$

after $\gamma_2$, the middle of the thickness of each edge of cones is in superposition and a second STE is produced with intensity given by:

$$I_{st_2} = M_0 \frac{1}{2} \sin\alpha \sin\beta \cos\gamma_1 \sin\gamma_2 e^{-\frac{T_{E2}}{T_2}} e^{-\frac{(T_{D_1}+T_{D_2})}{T_1}} \quad (4)$$

Thus, for a stimulated echo train, the signal is:

$$I_{st_i} = M_0 \frac{1}{2} \sin\alpha \sin\beta \left(\prod_{j=1}^{i-1} \cos\gamma_j\right) \sin\gamma_i e^{-\frac{T_{E2}}{T_2}} \left(\prod_{j=1}^{i} e^{-\frac{T_{D_1}}{T_1}}\right) i \geq 2 \quad (5)$$

The echo train can continue until a $\gamma_N = 90°$ occurs.

The Compensation

In this chapter, we have introduced the concept of compensation. The STE, in time, will fall to zero due to the $T_1$ relaxation. To prevent the last few STE to have a signal to noise ratio too low, when we select our flip angles we can introduce a factor $$\left(e^{-\frac{(constant)T_{D_n}}{T_1}}\right),$$

which corresponds to the $T_1$ relaxation between the two STE (if constant=1). The equation we use to calculate the set of flip angles has been presented by T. H. Mareci et al. and equates the relative signal intensity of the n−1 and n$^{th}$ STE. Introducing our factor we get:

$$e^{-\frac{(constant)T_{D_n}}{T_1}} \sin\gamma_n \left(\prod_{j=1}^{n-1} \cos\gamma_j\right) = \sin\gamma_{n-1} \left(\prod_{j=1}^{n-2} \cos\gamma_j\right) \quad (6)$$

Resolving the equation for $\gamma_{n-1}$ we find:

$$\gamma_{n-1} = \arctan\left(e^{-\frac{(constant)T_{D_n}}{T_1}} \sin\gamma_n\right) \quad (7)$$

Starting with the last $\gamma$ at 90°, we can find the whole flip angle series.

A particular case is with the constant=1, where all STE are of equal intensities (see FIG. 2). For constant=0, we get the TART by T. H. Mareci et al.

MRI Signal Noise

We have considered a uniform additive normal noise of mean 0 and standard deviation $\sigma_n$ for each image, with n representing the image number. The probability distribution of that noise is:

$$p_n(I) = \frac{1}{\sigma_n \sqrt{2\pi}} e^{-\frac{I^2}{2\sigma_n^2}} \quad (8)$$

where I is the intensity of the noise in a pixel.

To automatically evaluate the standard deviation $\sigma_n$ of the noise for any object, we have considered a zone of the image which lies outside of the object area.

Since we have a magnitude image, the mean intensity of the signal in that zone will be:

$$\mu = \int_{-\infty}^{\infty} |I| p_n(I) dI \quad (9)$$

$$= 2 \int_{0}^{\infty} I \frac{1}{\sigma_n \sqrt{2\pi}} e^{-\frac{I^2}{2\sigma_n^2}} dI \quad (10)$$

$$= \frac{2}{\sigma_n \sqrt{2\pi}} \frac{\Gamma(1)}{2\left(\frac{1}{2\sigma_n^2}\right)} \quad (11)$$

$$= \sigma_n \sqrt{\frac{2}{\pi}} \quad (12)$$

then, $$\sigma_n = \sqrt{\frac{\pi}{2}} \mu \quad (13)$$

This gives us a simple relation between the mean signal intensity from a zone of the image lying outside of the object and the noise anywhere in that image.

We should note that we have not considered any systematic noise, which could be present within or without the object. The σn calculated here is necessary to the fit procedure.

Fitting Procedure

The measured data are fitted in post-procesing to extract the $T_1$ value for each pixel using MINUIT. The Amplitude=

$$\left(M_0 e^{-\frac{T_{E2}}{T_2}}\right)$$

and $T_1$ are the variables fitted, $T_DS$, $\alpha$, $\beta$ and $\gamma_1$, are determined from the sequence parameters.

The standard deviation of $T_1$, $\sigma_{T1}$, obtained by the MINUIT procedure is scaled by a $$\sqrt{\frac{\chi^2}{DF}}$$

factor. Here, DF is the degree of freedom of the fit and is defined by $N-N_{para}$ where N is the number of data points and $N_{para}$ is the number of parameters to be fitted (Amplitude, $T_1$).

To study the sensitivity of the fitted $T_1$ with regard to the fluctuation of the $B_1$ field, we simulated the two sets of RF pulses: a BIR-4-S2 pulse, and a rectangular RF pulse. The simulated data are generated using equations 2 to 5. The results are fitted with the same procedure as the real data, with $\sigma_n=1$. When the BIR-4-S2 RF pulse is used, the flip angle is considered exact. For the rectangular RF pulse, the flip angle is multiplied by a $B_1$ relative factor. The FIG. 4c presents the simulation results for a material with a $T_1$ of 300 ms and uses the same parameters as those used for the experiment.

Material and Method

Figure 21:
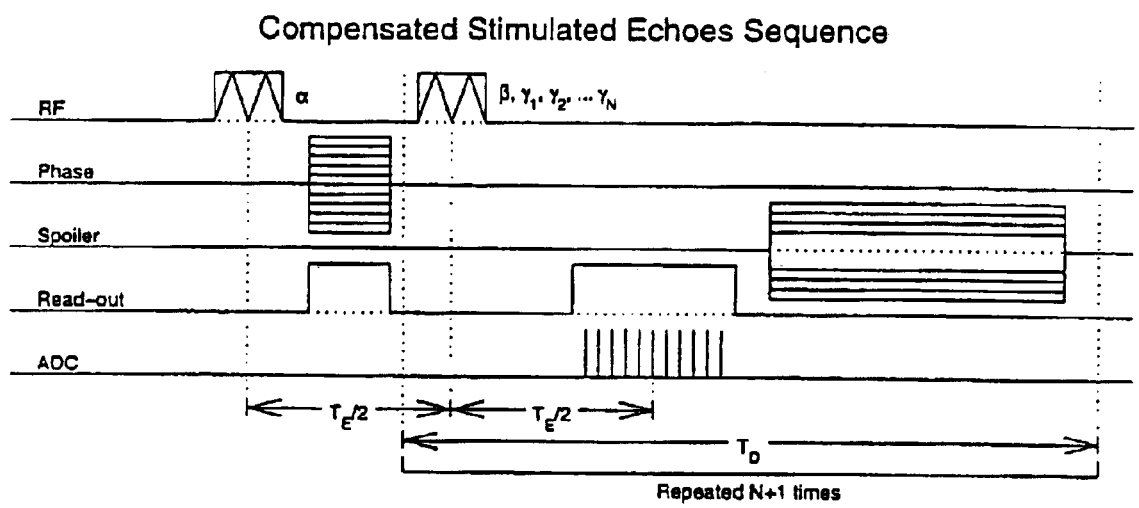
FIG. 21 illustrates the compensated stimulated echo sequence used to produce the data for the $T_1$ mapping. We have used N=7 stimulated echoes following a first spin-echo with $\alpha$=90°, $\beta$=90°, $\gamma_1$=16°, $\gamma_2$=18°, $\gamma_3$=21°, $\gamma_4$=25°, $\gamma_5$=31°, $\gamma_6$=42° and $\gamma_7$=90°. This RF set corresponds to factor=$e^{-0.3T_0/T_1}$. The timing is $T_R$3000 ms, $T_D$=100 ms and $T_E$=14 ms.

We programmed the compensated STE (FIG. 21) on a 1.5T Magnelom Vision (Siemens AG, Erlangen). The parameter values chosen are: equal $T_D$ of 100 ms, $T_E=14$ ms and $T_R=3000$ ms. More than 2 sec were added to the $T_R$ between the last echo and next repetition to allow for complete relaxation of material with long $T_1$.

Two sets of RF pulses are used in the sequence: BIR-4-S2 pulse and rectangular RF pulse. The flip angles used to produce the echoes are: $\alpha=90°$, $\beta=90°$, $\gamma_1=16°$, $\gamma_2=18°$, $\gamma_3=21°$, $\gamma_4=25°$, $\gamma_5=31°$, $\gamma_6=42°$ and $\gamma_7=90°$. This series is calculated for a factor with constant=0.3, $T_D=100$ ms and $T_1=300$ ms.

We have used a smooth rectangular phantom (50×20×10 cm) and a head coil with the major axis along the Boz main magnetic field and the minor axis normal to the sagital slice. The phantom is filled with a water solution of $T_1=300$ ms (table 1).

We eliminated from the fit those data sets where the signal to noise ratio of the last point was too low by applying a threshold and we then set the result to zero. The threshold was chosen so that:

$$SNR_{si7}(x, y) = \frac{I_{si7}(x, y)}{\sigma_{si7}} > 12 \qquad (14)$$

To corroborate the simulation of the effect of $B_1$ over the fitted $T_1$, we mapped the $B_1$ over of the imaged zone. We used a gradient echo sequence with a standard rectangular RF pulse on a range of RF powers to produce a series of images. From those images, we determined for each pixel the relative RF amplitude needed to obtain a true 180° (i.e. to obtain the minimum pixel intensity through the series).

Results

Figure 22A:
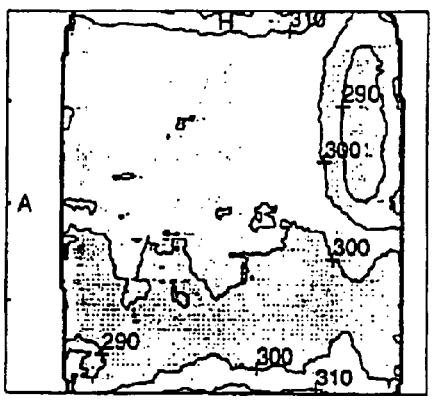
FIGS. 22a–22d illustrate compensated stimulated echo sequence $T_1$ mapping obtained on smooth rectangular phantom (50×20×10 cm) filled with water solution (T1$\approx$300 ms). The phantom is placed in a head coil with the major axis along the $B_0\hat{z}$ main magnetic field and the minor axis normal to the sagital slice. Two sets of RF pulses are presented in the following figures: BIR-4-S2 RF pulse set, as shown in FIG. 22a and rectangular RF pulse set, as shown in FIG. 22b.
Figure 22B:
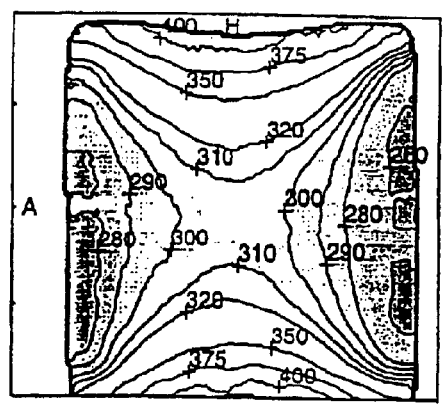
Figure 22C:
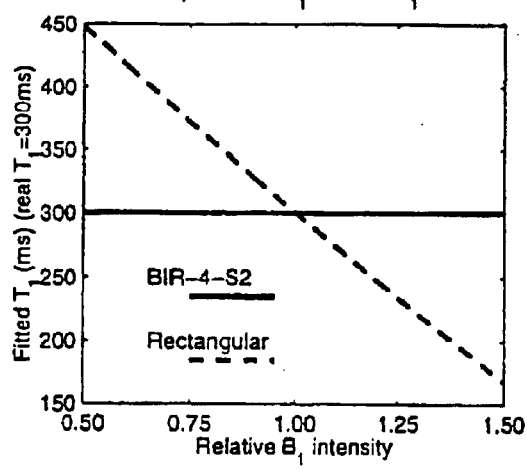
Figure 22D:
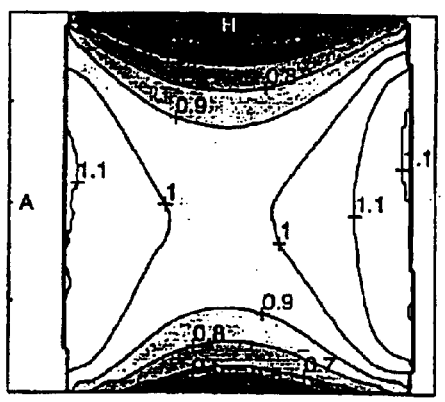

At FIG. 22d, we present the sagital $B_1$ mapping of the head coil onto our phantom. We see that the $B_1$ ranges from 0.45 to 1.19. The field of view shown is 240×240 mm.

The results of the simulation are shown in the FIG. 22c. When we use the rectangular RF pulse set, we see that $T_1$ is largely mis-estimated linearly with a negative slope with regards to $B_1$. The $T_1$ mis-estimation is approximately $\mu$ 20% for a relative deviation of B1 of ±25%.

At FIGS. 22a and 22b, we present the two compensated stimulated echo $T_1$ mapping tests which correspond to the $B_1$ mapping of FIG. 22d and corroborate our simulation shown at FIG. 22c.

a) BIR-4-S2 RF set, this is the most precise case were the flip angles obtained are independent of $B_1$. We see an excellent uniformity across the sagital slab over the whole head coil area.

The $T_1$ values vary from 281 ms to 330 ms at the very limits of the imaged area. At the centre of the image, the $T_1$ value is 302 ms with a standard deviation of 5 ms.

b) rectangular RF set, this is the standard RF set-up when no adiabatic or pseudo-adiabatic pulses are available. Other than in the centre of the image, where the flip angles are more accurate, the mapping varies considerably because of the sensitivity of the signal intensity to the flip angles.

In this instance, the $T_1$ values vary from about 253 ms to 450 ms throughout the mapping area, while the $T_1$ value is 307 ms with a standard deviation of 5 ms at the centre of the image.

Discussion

The use of RF pulses which produce precise flip angles, such as a BIR-4-S2 RF pulse, greatly improves the accuracy and uniformity of the $T_1$ mapping in the compensated stimulated echo sequence. From 50% systematic error on the value of $T_1$ for the rectangular set of RF pulses, the error is reduced to 10% for the BIR-4-S2 set. This is a direct advantage of the BIR-4-S2, which is due to its large insensitivity to $B_1$ variations.

A disadvantage of using a BIR-4-S2 RF pulse is the lack of slice-selectivity. The BIR-4-S2 is a 3D pulse only while the rectangular RF pulse does not have that disadvantage since it could easily be replaced by slice-selective sinc pulses.

A second disadvantage of using the BIR-4-S2 is the increase of SAR as compared to the rectangular pulse; however, we can usually keep it below the clinical limits.

The introduction of the compensation to the flip angle calculation within the TART basic principle opens this technique to a wider range of possibilities. The main advantage of the compensation is revealed when the SNR becomes too low in the last few measured echoes to be used effectively in the fit procedure. By decreasing the factor in the flip angle calculation, the signal intensity produced is higher for the few last echoes, at the cost of lower signal intensity for the first few.

This compensation for the $T_1$ relaxation does not conserve the total amount of signal from all echoes. For some combination of parameters ($T_1$ and $T_D$) a factor could be found which maximises the sum of all echo signal to optimise the global SNR and improves the precision of the $T_1$ fit.

Conclusion

The compensated stimulated echo sequence is a useful and powerful tool in MRI. It offers a reliable, uniform and precise way to determine $T_1$ of simple compounds, especially when use in combination with the BIR-4-S2 RF pulse.

TABLE 1

Performance comparison between rectangular 90°, AHP-S1, AHP-S2 and AHP [18] rf pulses for a $B_{1ref}$ of 30 µT.

|  | Rect 90° | AHP-S1 | AHP-S2 | AHP |
|---|---|---|---|---|
| App. Time | 200 µs | 280 µs | 517 µs | 8000 µs |
| Relative SAR | 1 | 1.4 | 2.6 | 28 |
| $\Delta\alpha\left(\frac{B_1}{B_{1ref}}\right)\bigg|_{B_1=B_{1ref}}$ | $90°\left(\frac{B_1}{B_{1ref}}-1\right)$ | $\approx 57°\left(\frac{B_1}{B_{1ref}}-1\right)$ | $\approx 30°\left(\frac{B_1}{B_{1ref}}-1\right)^2$ | |

TABLE 2

Definitions of the differences between obtained and requested angles.

|  | Obtained by our BIR-4-Si |  | Theoretical result |
|---|---|---|---|
| $\Delta\alpha =$ | $\alpha$ | - | $\alpha_{req}$ |
| $\Delta\theta =$ | $\theta$ | - | 0 |
| $\Delta\phi =$ | $\phi$ | - | 0 |

TABLE 3

Comparison of typical results obtained with the T1 mapping sequence: TOMROP-Look-Locker, compensated stimulated echoes and inversion recovery. All sequences used a BIR-4-S2 RF pulse for the presented values.

| $T_1$ mapping | TOMROP-Look-Locker | Compensated stimulated echoes | Inversion recovery |
|---|---|---|---|
| Water solution | 304 ± 1.4 ms | 302 ± 5 ms | 295.8 ± 0.2 ms |

TABLE 4

Comparison of typical results obtained with the $T_1$ mapping sequence: TOMROP-Look-Locker, compensated stimulated echoes and inversion recovery.

| $T_1$ mapping | TOMROP-Look-Locker | Compensated stimulated echoes | Inversion recovery |
|---|---|---|---|
| Water solution | 304 ± 1.4 ms | 302 ± 5 ms | 295 ± 0.2 ms |

Figure 23:
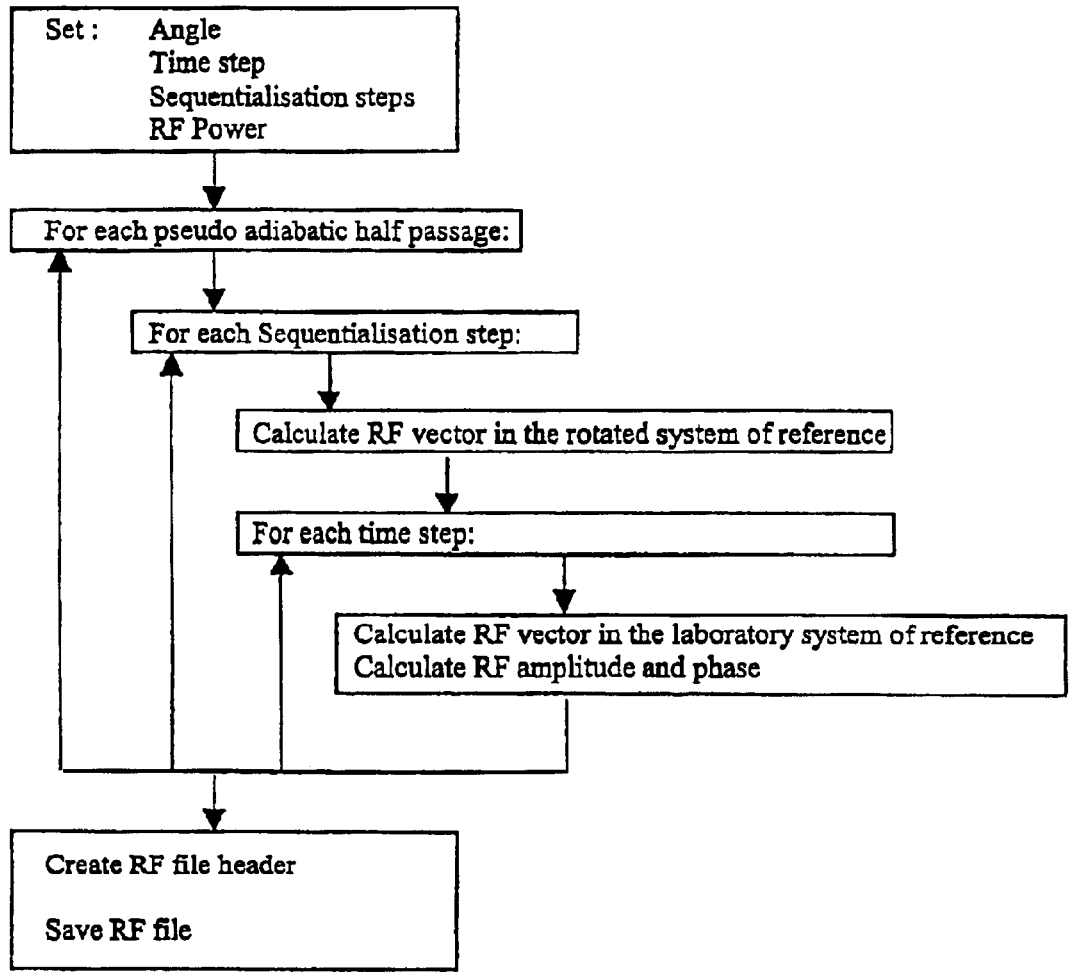
FIG. 23 is a flowchart of a method for creating a BIR-4-$S_i$ RF pulse according to an embodiment of the present invention.

FIG. 23 discloses a method for converting a BIR-4 adiabatic RF pulse into a BIR-4-Si pseudo-adiabatic pulse. For each pseudo adiabatic half passage the angle time, time step, initial RF power and the number of sequentialisation steps may be set. The number of sequentialisation steps being i provides that the number of sequentialisation steps may be any number between 1 and infinity. The RF vector is calculated in a rotated system of reference for each sequentialisation step and each time step. The RF factor is calculated in a laboratory frame of reference. The RF amplitude and phase are calculated. The calculation steps are repeated until the desired angle, time step, RF power have been realised and the number sequentialisation steps have been completed. The calculated values are stored in an RF file having a corresponding file header created to identify the calculated pulse properties.

Although the present invention has been described by way of preferred embodiments thereof, it should be understood that any modification within the scope of the invention to these preferred embodiments within the scope of the appended claims are not deemed to alter or change the nature and scope of the present invention.

What is claimed is:

1. In an MRI system, a method for converting an adiabatic RF pulse into a pseudo adiabatic pulse having at least one step, said MRI system including a magnet for producing a magnetic field about a subject, gradient coils, RF coils, means for emitting an RF pulse and means for receiving RF waves, and means for analyzing said RF waves, said adiabatic RF pulse having at least one adiabatic half passage, said method comprising the steps of:

setting the angle, time step and desired RF power for each time step within a pseudo adiabatic half passage in said means for emitting an RF pulse;

replacing each half passage adiabatic pulse with at least one RF pulse of predetermined power which is adapted to provide a magnetic field vector at said angle from a main magnetic field.

2. A method according to claim 1, wherein said pseudo adiabatic pulse has one step.

3. A method according to claim 1, wherein said pseudo adiabatic pulse has four steps.

4. A method according to claim 1, wherein said adiabatic RF pulse is a BIR-4 pulse.

5. A method according to claim 2, wherein said angle is 45 degrees.

6. An MRI system comprising:

a magnet for producing a magnetic field about a subject;

gradient coils;

RF coils;

means for emitting an RF pulse and means for receiving RF waves;

means for analyzing said RF waves;

means for converting an adiabatic RF pulse having at least one adiabatic half passage into a pseudo adiabatic RF pulse comprising means for setting the angle, time step and desired RF power for each time step within a pseudo adiabatic half passage in said means for emitting an RF pulse; and means for replacing each half passage adiabatic pulse with at least one RF pulse of predetermined power which is adapted to provide a magnetic field vector at said angle from a main magnetic field.

* * * * *